(12) United States Patent
Huang

(10) Patent No.: US 11,121,026 B2
(45) Date of Patent: Sep. 14, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventor: Yu-Lien Huang, Jhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 274 days.

(21) Appl. No.: 16/208,213

(22) Filed: Dec. 3, 2018

(65) Prior Publication Data

US 2020/0135547 A1 Apr. 30, 2020

Related U.S. Application Data

(60) Provisional application No. 62/753,733, filed on Oct. 31, 2018.

(51) Int. Cl.
| | |
|---|---|
| *H01L 21/768* | (2006.01) |
| *H01L 29/66* | (2006.01) |
| *H01L 21/311* | (2006.01) |

(52) U.S. Cl.
CPC .. *H01L 21/76816* (2013.01); *H01L 21/31116* (2013.01); *H01L 21/31144* (2013.01); *H01L 21/76805* (2013.01); *H01L 21/76895* (2013.01); *H01L 29/66795* (2013.01)

(58) Field of Classification Search
CPC ........ G03F 7/0035; G03F 7/094; G03F 7/095; H01L 23/528; H01L 21/76811; H01L 21/76816; H01L 21/31144
See application file for complete search history.

(56) References Cited

U.S. PATENT DOCUMENTS

| | | |
|---|---|---|
| 6,787,469 B2 | 9/2004 | Houston et al. |
| 7,550,773 B2 | 6/2009 | Booth et al. |
| 9,397,004 B2 | 7/2016 | Bouche et al. |

(Continued)

FOREIGN PATENT DOCUMENTS

| | | |
|---|---|---|
| TW | 201701475 A | 1/2017 |
| TW | 1574309 B | 3/2017 |

(Continued)

*Primary Examiner* — Zandra V Smith
*Assistant Examiner* — Abbigale A Boyle
(74) *Attorney, Agent, or Firm* — Slater Matsil, LLP

(57) ABSTRACT

Methods of patterning openings for conductive contacts in a target layer of a semiconductor device and methods of forming conductive contacts. The method of patterning openings may be used to form contact openings in an inter-layer dielectric (ILD) layer of a semiconductor substrate for contacts to source/drain regions of FinFET devices. A hard mask layer may be patterned to form a cut mask by transferring slotted openings of a first middle layer of a tetra-layer photoresist and a cut MD pattern of a photoresist layer formed over the first middle layer of the tetra-layered photoresist using photolithography techniques. Once the cut mask is formed, contact openings are formed within the ILD layer down to the source/drain regions of the FinFET devices of the semiconductor substrate. The contact openings may be filled with conductive material(s) to define conductive contacts (e.g., conductive plugs).

20 Claims, 20 Drawing Sheets

(56) References Cited

U.S. PATENT DOCUMENTS

2013/0337650 A1\* 12/2013 Lee .................. H01L 21/76811
  438/702
2016/0103396 A1   4/2016 Liou et al.
2016/0365275 A1\* 12/2016 Chang ............... H01L 21/76813

FOREIGN PATENT DOCUMENTS

TW      1587479 B   6/2017
TW    201826336 A   7/2018

\* cited by examiner

SEMICONDUCTOR DEVICE AND METHOD OF MANUFACTURE

PRIORITY CLAIM

This application claims the benefit of U.S. Provisional Application No. 62/753,733, filed on Oct. 31, 2018, which application is hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-9B illustrate intermediate stages in the formation of contact openings in a target layer structure during the manufacture of FinFET devices and corresponding contact plugs in accordance with some embodiments. The figures designated with an "A" represent a perspective view of an intermediate structure resulting from a respective intermediate stage in the forming of the contact openings, in accordance with some embodiments. The figures designated with a "B" represent a corresponding top view of the intermediate structure as viewed from above, in accordance with some embodiments.

FIGS. 1A-1B illustrate the patterning of a first photoresist layer of a tetra-layer photoresist layer in accordance with some embodiments.

FIGS. 9A-9B illustrate the forming of conductive plugs over source/drain regions in the patterned target layer in accordance with some embodiments.

DETAILED DESCRIPTION

Figure 1A:
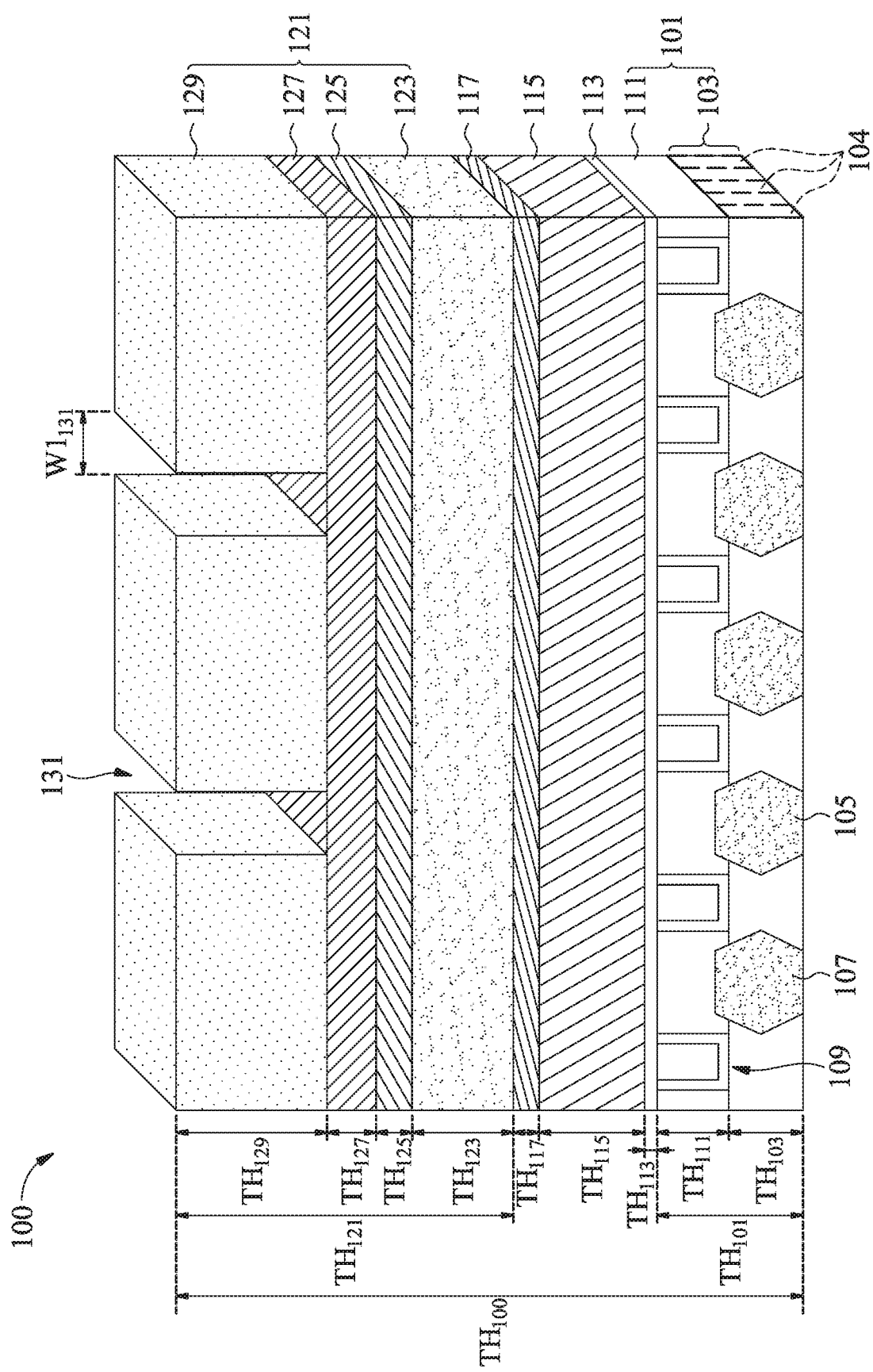

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming semiconductor devices are provided in accordance with some embodiments. In some embodiments, a patterning process is performed to pattern openings for conductive features in a target layer of a semiconductor device. For example, the patterning process may be used to form openings for contacts to a transistor device such as source/drain contacts or gate contacts. In an embodiment, the target layer may be a low-k dielectric layer or oxide layer, in which openings are formed using a hard mask layer. A pattern may be transferred into the hard mask layer using photolithography and a patterned tetra-layer photo scheme, according to some embodiments. Subsequently, conductive material(s) may be filled in the openings of the target layer to define conductive features, the conductive features having cuts as defined by the second dielectric layer. Some of the conductive features may have a fine pitch or some of the cuts may have a fine pitch.

Figure 1B:
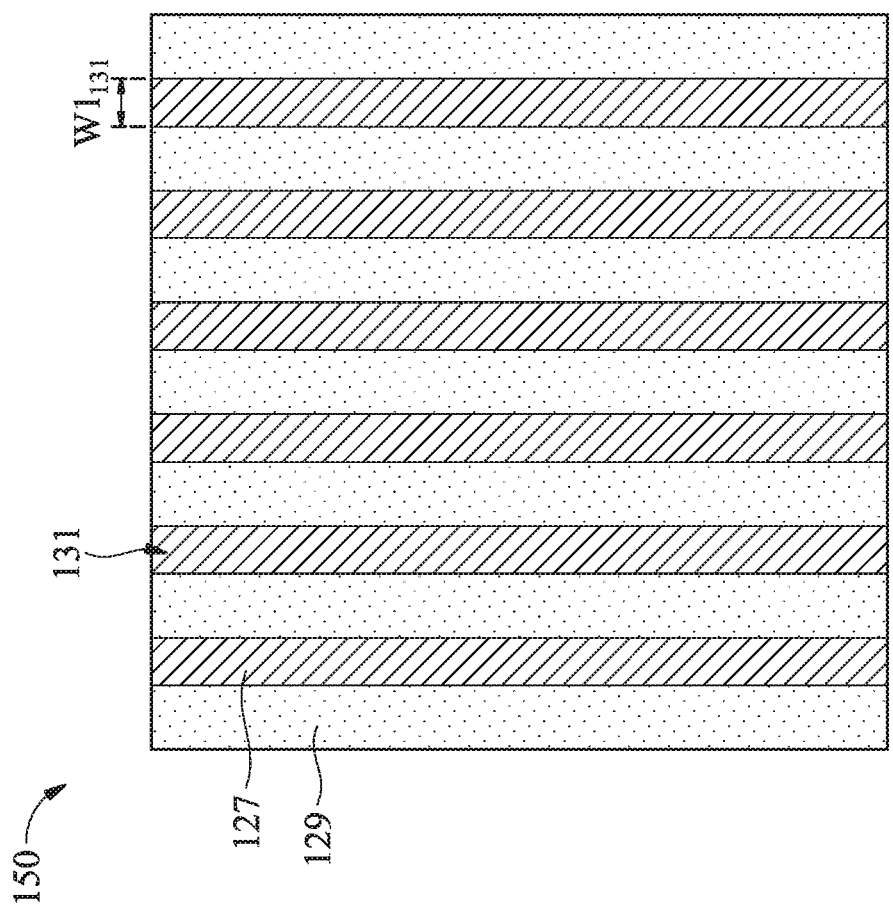

FIGS. 1A-1B illustrate a first intermediate structure 100 resulting from an intermediate step in a process of forming contacts for a semiconductor structure 101, according to some embodiments.

In an embodiment, the semiconductor structure 101 may comprise a substrate 103 with semiconductor fins 104, source regions 105 and drain regions 107 formed within the substrate 103, and an interlayer dielectric layer 111 with gate regions 109 formed within the interlayer dielectric layer 111. In an embodiment, the source regions 105, drain regions 107 and gate regions 109 may be formed as a plurality of Field-effect Transistor (FinFET) devices within the semiconductor structure 101. The semiconductor structure 101 may be formed of a semiconductor material such as silicon, doped or undoped, or an active layer of a semiconductor-on-insulator (SOI) substrate. The semiconductor structure 101 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In an embodiment, the substrate 103 may be have a thickness $Th_{103}$ of between about 100 nm and about 200 nm, such as about 150 nm and the interlayer dielectric layer 111 may be deposited to an overall thickness $Th_{in}$ of between about 10 nm and about 50 nm, such as about 20 nm. However, any suitable thicknesses may be used for the substrate 103 and for interlayer dielectric layer 111. As such, the overall thickness $Th_{101}$ of the semiconductor structure 101 may be between about 110 nm and about 250 nm, such as about 170 nm.

FIG. 1A further illustrates an optional etch stop layer 113 disposed over and being in physical contact with the semiconductor structure 101. In an embodiment, the etch stop layer 113 may be formed over the fins, the source regions 105, the drain regions 107 and the gate regions 109 of one or more FinFET devices formed within the semiconductor structure 101. In some embodiments, the etch stop layer 113 may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), plasma physical vapor deposition (PVD), or the like. However, any suitable materials and processes may be used. In an embodiment, the etch stop layer 113 may be deposited to an overall thickness $Th_{113}$ of between about 2 nm and about 10 nm, such as about 5 nm. However, any suitable thickness may be used for the etch stop layer 113.

FIG. 1A further illustrates a target layer 115 disposed directly on top of the etch stop layer 113, according to an embodiment. During a subsequently performed etching process performed on the target layer 115, the etch stop layer 113 may act as a stop for the etching process. As such, the materials and processes selected to form the etch stop layer 113 may be selected based on and coordinated with the material selected to form the target layer 115. In some embodiments, the target layer 115 is a dielectric layer such as an inter-layer dielectric (ILD0) layer and may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), spin-on coating, or the like. However, any other suitable materials and processes may be used to form the target layer 115. In an embodiment, the target layer 115 may be deposited to an overall thickness $Th_{115}$ of between about 50 nm and about 150 nm, such as about 80 nm. However, any suitable thickness may be used for the target layer 115.

Although FIG. 1A illustrates the target layer 115 being in physical contact with the etch stop layer 113, any number of intervening layers may be disposed between the target layer 115 and the etch stop layer 113. Such intervening layers may include other ILD layers, and may have contact plugs, conductive lines, and/or vias formed therein, or may include one or more intermediary layers (e.g., etch stop layers, adhesion layers, etc.), combinations thereof, and the like.

A hard mask layer 117 may be formed over the target layer 115. The hard mask layer 117 may be formed of a material that includes a metal (e.g., titanium nitride (TiN), titanium, tantalum nitride, tantalum, a metal-doped carbide (e.g., tungsten carbide (WC)), or the like) and/or a metalloid (e.g., silicon nitride, boron nitride, silicon carbide, or the like). In some embodiments, a material composition of the hard mask layer 117 may be determined to provide a high etch selectivity with respect to other layers such as the target layer 115, and/or with respect to other subsequently formed layers. The hard mask layer 117 may be formed by a process such as Chemical Vapor Deposition (CVD), Atomic Layer Deposition (ALD), or the like. However, any suitable processes and materials may be used. In some embodiments, the hard mask layer 117 has a thickness $Th_{117}$ between about 20 nm and about 50 nm, although in other embodiments the hard mask layer 117 may have another suitable thickness.

FIG. 1A further illustrates a first tetra-layer photoresist 121 that is formed over the hard mask layer 117. In an embodiment, the first tetra-layer photoresist 121 includes a plurality of masking layers which may be blanket deposited sequentially using, for example, spin-on processes. In other embodiments, one or more of the plurality of masking layers may be deposited using a process such as Chemical Vapor Deposition (CVD), Atomic Layer Deposition (ALD), or the like. However, any suitable processes and any suitable combination of processes may be used to deposit the layers of the first tetra-layer photoresist 121. In an embodiment, the first tetra-layer photoresist 121 may be deposited to an overall thickness $Th_{121}$ of between about 120 nm and about 500 nm, such as about 210 nm. However, any suitable thickness may be used for the first tetra-layer photoresist 121.

As further illustrated in FIG. 1A, the first tetra-layer photoresist 121 includes a bottom layer 123 that is formed, according to an embodiment, over the hard mask layer 117. The bottom layer 123 may be formed of a polymer in some embodiments. In an embodiment, the bottom layer 123 may be a bottom anti-reflective coating (BARC) layer. According to an embodiment, the bottom layer 123 may be formed from a material comprising, for example, $C_xH_yO_z$, using a spin-on process. However, any suitable materials and any suitable process may be used to form the bottom layer 123. In an embodiment, the bottom layer 123 may be deposited to a thickness $Th_{123}$ of between about 50 nm and about 200 nm, such as about 150 nm. However, any suitable thickness may be used.

The first tetra-layer photoresist 121 further comprises a second middle layer 125 that is formed over the bottom layer 123. The second middle layer 125 may be formed from a material such as $Si_xH_yC_zO_w$, silicon, or a metal oxide using one or more deposition processes such as, spin-on, CVD, ALD, or the like. However, any suitable materials and processes may be used to form the second middle layer 125. In some embodiments, a material composition of the second middle layer 125 may be determined to provide a high etch selectivity with respect to some layers such as the bottom layer 123 and/or the hard mask layer 117 or other layers which may provide etch stop capabilities with respect to patterning the second middle layer 125. The second middle layer 125 may include more than one layer and may include more than one material. In some embodiments, the second middle layer 125 has a thickness $Th_{125}$ of between about 20 nm and about 50 nm, such as about 30 nm. However, any suitable thickness of the second middle layer 125 may be used.

The first tetra-layer photoresist 121 further comprises a first middle layer 127 that is formed over the second middle layer 125. The first middle layer 127 may be formed using one or more deposition processes such as, spin-on, CVD, ALD, or the like. However, any suitable process may be used to form the first middle layer 127. In some embodiments, a material composition of the first middle layer 127 may be determined to provide a high etch selectivity with respect to other layers such as the bottom layer 123, the second middle layer 125 or other layers (e.g., photo resist materials) which may provide etch stop capabilities with respect to patterning the first middle layer 127. The first middle layer 127 may comprise an inorganic material, which may be a nitride (such as silicon nitride), an oxynitride (such as silicon oxynitride), an oxide (such as silicon oxide), or the like. However, any suitable material may be used to form the first middle layer 127. Furthermore, the first middle layer 127 may include more than one layer and may include more than one material. In some embodiments, the first middle layer 127 has a thickness $Th_{127}$ of between about 20 nm and about 50 nm, such as about 30 nm. However, any suitable thickness of the first middle layer 127 may be used.

The first tetra-layer photoresist 121 further includes a first photoresist layer 129 over the first middle layer 127. The first photoresist layer 129 may be formed of a photoresist (e.g., a photosensitive material), which includes organic materials, and may be a positive photosensitive material or a negative photosensitive material. The first photoresist layer 129 may be formed using one or more deposition processes such as a spin-on process, or the like. However, any suitable process may be used to form the first photoresist layer 129. In some embodiments, the first photoresist layer 129 has a thickness $Th_{129}$ of between about 30 nm and about 200 nm, such as about 100 nm. However, any suitable thickness of the first photoresist layer 129 may be used. As such, according to some embodiments, the first intermediate structure 100 may have a thickness $Th_{100}$ of between about 312 nm and about 1460 nm, such as about 615 nm. However, any suitable thickness of the first intermediate structure 100 may be used.

FIGS. 1A-1B further illustrate a patterning of the first photoresist layer 129 (e.g., using a photolithographic masking and etching process). Once deposited, the first photoresist layer 129 may be patterned to provide first slot openings 131 in the first photoresist layer 129. In an embodiment, the first slot openings 131 may have a first width $W1_{131}$ in the first photoresist layer 129 of between about 40 nm and about 60 nm, such as about 45 nm. However, any suitable width may be used. In some embodiments, the first slot openings 131 in the first photoresist layer 129 may have different first widths $W1_{131}$. In some embodiments, a single first slot opening 131 in the first photoresist layer 129 may have more than one width.

As seen in the top view 150 of the first intermediate structure 100 illustrated in FIG. 1B, a series of the first slot openings 131 expose surface areas of the first middle layer 127 through the patterned first photoresist layer 129. As such, the remaining portions of the first photoresist layer 129 serve as a mask layer over the first middle layer 127.

Figure 2A:
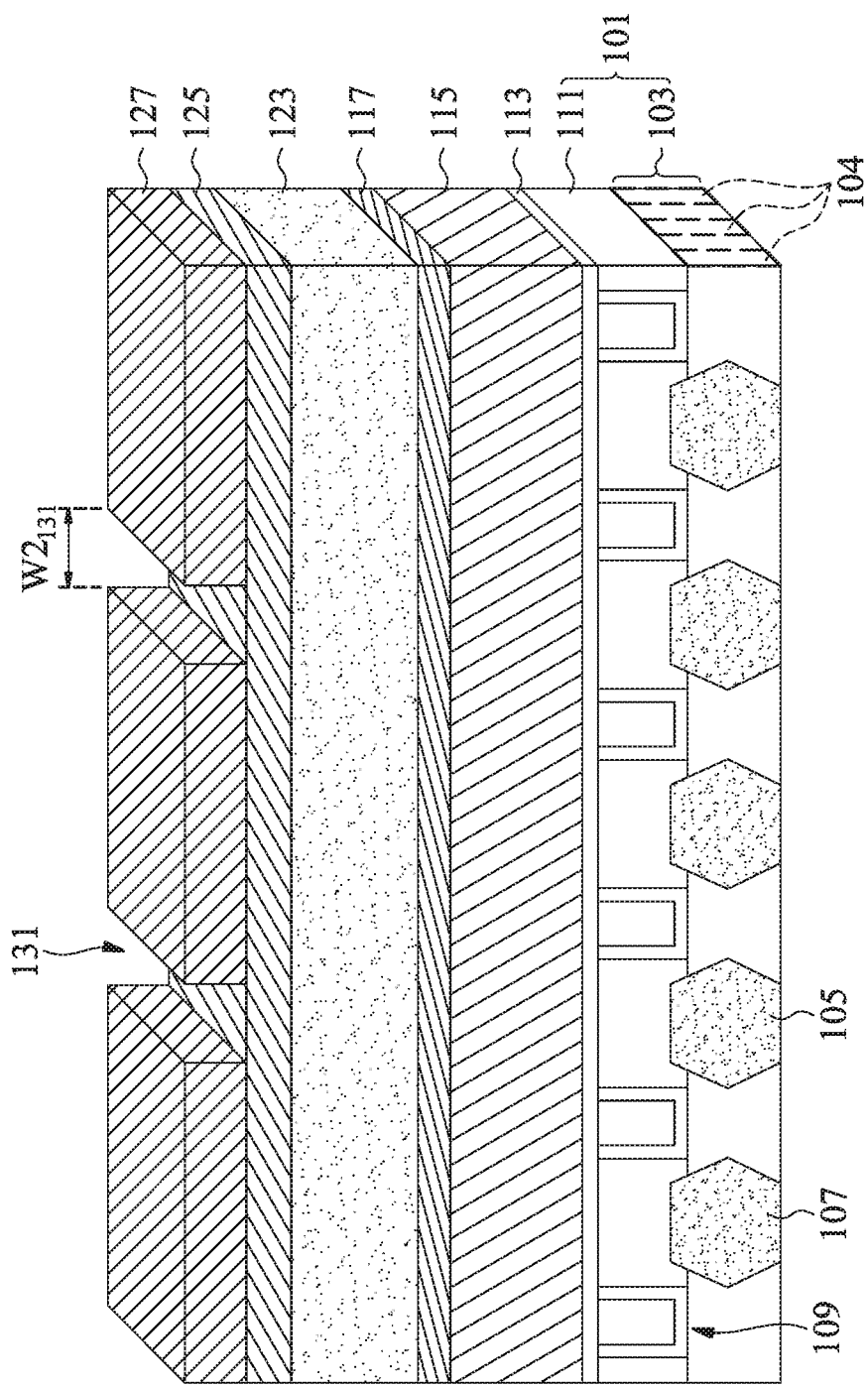
FIGS. 2A-2B illustrate the first patterning of a first middle layer of the tetra-layer photoresist in accordance with some embodiments.
Figure 2B:
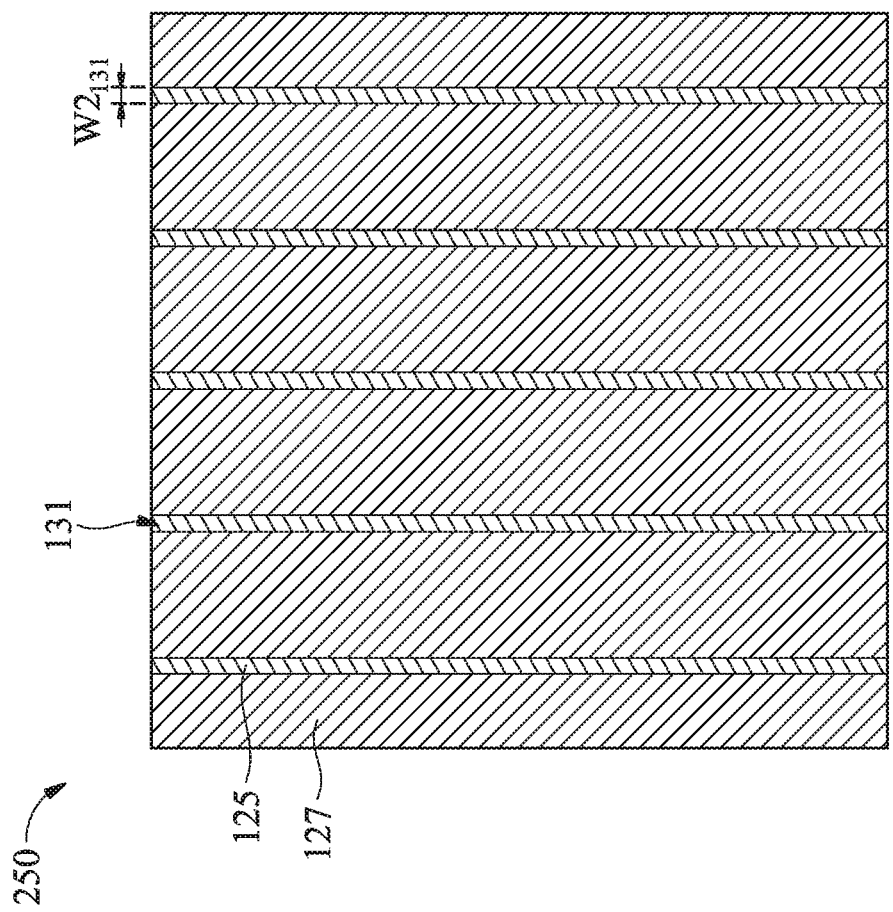

FIGS. 2A-2B illustrate a first etching process for transferring the pattern of the first photoresist layer 129 shown in FIG. 1A into the first middle layer 127. The first middle layer 127 has a high etching selectivity relative to the first photoresist layer 129 and the second middle layer 125. In an embodiment, the first photoresist layer 129 is used as an etching mask for a first patterning of the first middle layer 127. The etching process may be anisotropic, so that the first slot openings 131 in the first photoresist layer 129 are extended through the first middle layer 127. The etching method used to pattern the first middle layer 127 may be selected from Reactive Ion Etching (RIE), which may be implemented using Inductively Coupled Plasma (ICP), Capacitively Coupling Plasma (CCP), or the like. The process gases may include an etching gas(es) and a polymer-forming gas(es). In accordance with some embodiments, the etching gas may include a fluorine-containing gas such as $CF_4$, $NF_3$, or combinations thereof. The polymer-forming gas may include $CHF_3$, $CH_2F_2$, $CH_3F$, $C_4F_6$, $C_4F_8$, or the combinations thereof. The pressure of the process gases may be in the range between about 5 mt and about 200 mt. The temperature of wafer 10 during the etching may be in the range between about 0° C. and about 50° C. According to an embodiment, the first slot openings 131 in the first middle layer 127 may have a second width $W2_{131}$. In an embodiment, the first slot openings 131 may have about the same sizes (or are slightly smaller) in the first middle layer 127 as they do in the first photoresist layer 129. In other embodiments, the second width $W2_{131}$ in the first middle layer 127 may be different from the first width $W1_{131}$ in the first photoresist layer 129, for example, due to critical dimension (CD) shrinkage. According to an embodiment, the second width $W2_{131}$ of the first slot openings 131 in the first middle layer 127 may be between about 6 nm and about 12 nm, such as about 9 nm. However, any suitable width may be used. As seen in the top view 250 of the second intermediate structure 200 in FIG. 2B, a series of the first slot openings 131 expose first surfaces of the second middle layer 125 through remaining portions of the first middle layer 127.

As the pattern of the first photoresist layer 129 is transferred into the first middle layer 127, the sizes and characteristics of the first slot openings 131 in the first photoresist layer 129 are transferred into the sizes and characteristics of the first slot openings 131 in the first middle layer 127. As such, depending on the characteristics of the first slot openings 131 in the first photoresist layer 129, in some embodiments, the second widths $W2_{131}$ of the first slot openings 131 in the first middle layer 127 may be different from one another. In some embodiments, a single first slot opening 131 in the first middle layer 127 may have more than one width. Once the first openings 131 have been formed in the first middle layer 127, any remaining portions of the first photoresist layer 129 may be removed exposing the remaining portions of the first middle layer 127.

Figure 3A:
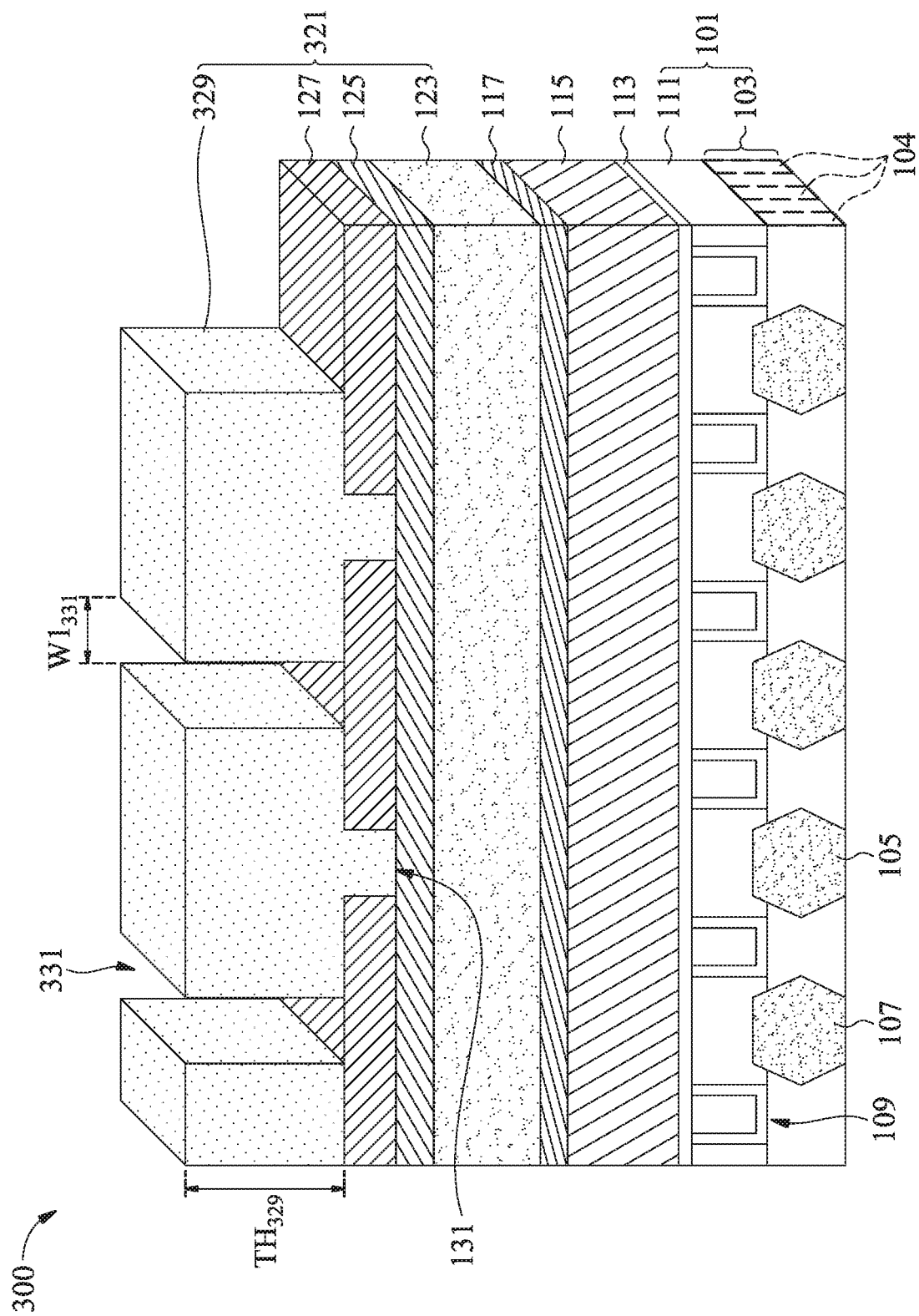
FIGS. 3A-3B illustrate the deposition and patterning of a second photoresist layer of the tetra-layer photoresist in accordance with some embodiments.
Figure 3B:
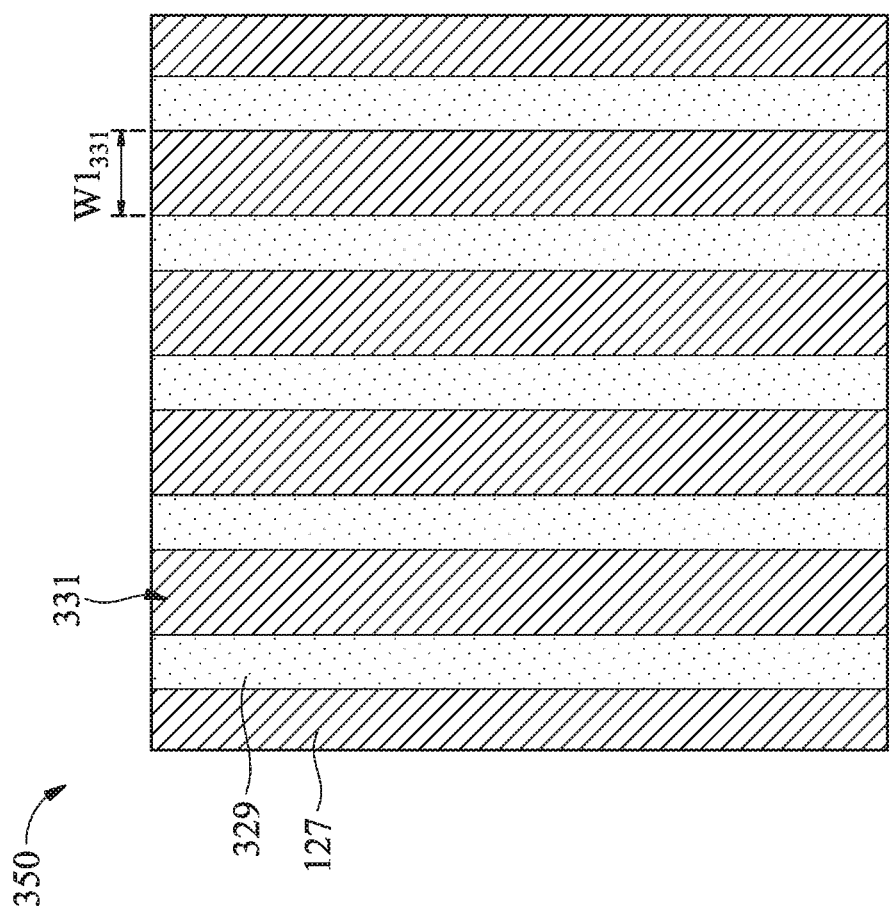

FIGS. 3A-3B illustrate a deposition of a second photoresist layer 329 over the patterned first middle layer 127 and filling the first slot opening over exposed portions of the second middle layer 125 between the first slot opening 131 in the first middle layer 127. As such, the bottom layer 123, the second middle layer 125, the first middle layer 127 and the second photoresist layer 329 together form a second tetra-layer photoresist 321. In some embodiments, the materials and processes used to deposit the second photoresist layer 329 may be the same as those used to deposit the first photoresist layer 129 and form the first slot openings 131, as described above. For example, a spin-on process, or the like, may be used to deposit a photosensitive material as the second photoresist layer 329 over the patterned first middle layer 127. However, any suitable materials and processes may be used to deposit the second photoresist layer 329.

In some embodiments, the second photoresist layer 329 may have the same thickness as that of the first photoresist layer 129. In other embodiments, the second photoresist layer 329 may have a different thickness from the thickness of the first photoresist layer 129. In an embodiment, the second photoresist layer 329 has a thickness $Th_{329}$ of between about 50 nm and about 200 nm, such as about 100 nm. However, any suitable thickness of the second photoresist layer 329 may be used.

FIGS. 3A-3B further illustrate a patterning of the second photoresist layer 329. In an embodiment, the patterned second photoresist layer 329 with the second slot openings 331 may have an overlap shift of the patterned first photoresist layer 129. In some embodiments, the processes used to form the second slot openings 331 in the second photoresist layer 329 may be the same as those used to form the first slot openings 131 in the first photoresist layer 129, as described above. For example, a photolithographic process may be used to form the second slot openings 331 in the second photoresist layer 329. However, any suitable materials and processes may be used to form the second slot openings 331 of the second photoresist layer 329. Accordingly, second slot openings 331 in the second photoresist layer 329 expose second surfaces of the first middle layer 127 through the patterned second photoresist layer 329. As illustrated in the top view 350 of the third intermediate structure 300, a series of the second slot openings 331 expose second surfaces of the first middle layer 127 through the patterned second photoresist layer 329.

In some embodiments, the second slot openings 331 of the second photoresist layer 329 may have the same widths as the first slot openings 131 of the first photoresist layer 129. In other embodiments, the second slot openings 331 of the second photoresist layer 329 may have different widths from the first slot openings 131 of the first photoresist layer 129. In an embodiment, the second slot openings 331 of the second photoresist layer 329 have a first width $W1_{331}$ of between about 40 nm and about 60 nm, such as about 45 nm. However, any suitable widths of the second slot openings 331 of the second photoresist layer 329 may be used.

Figure 4A:
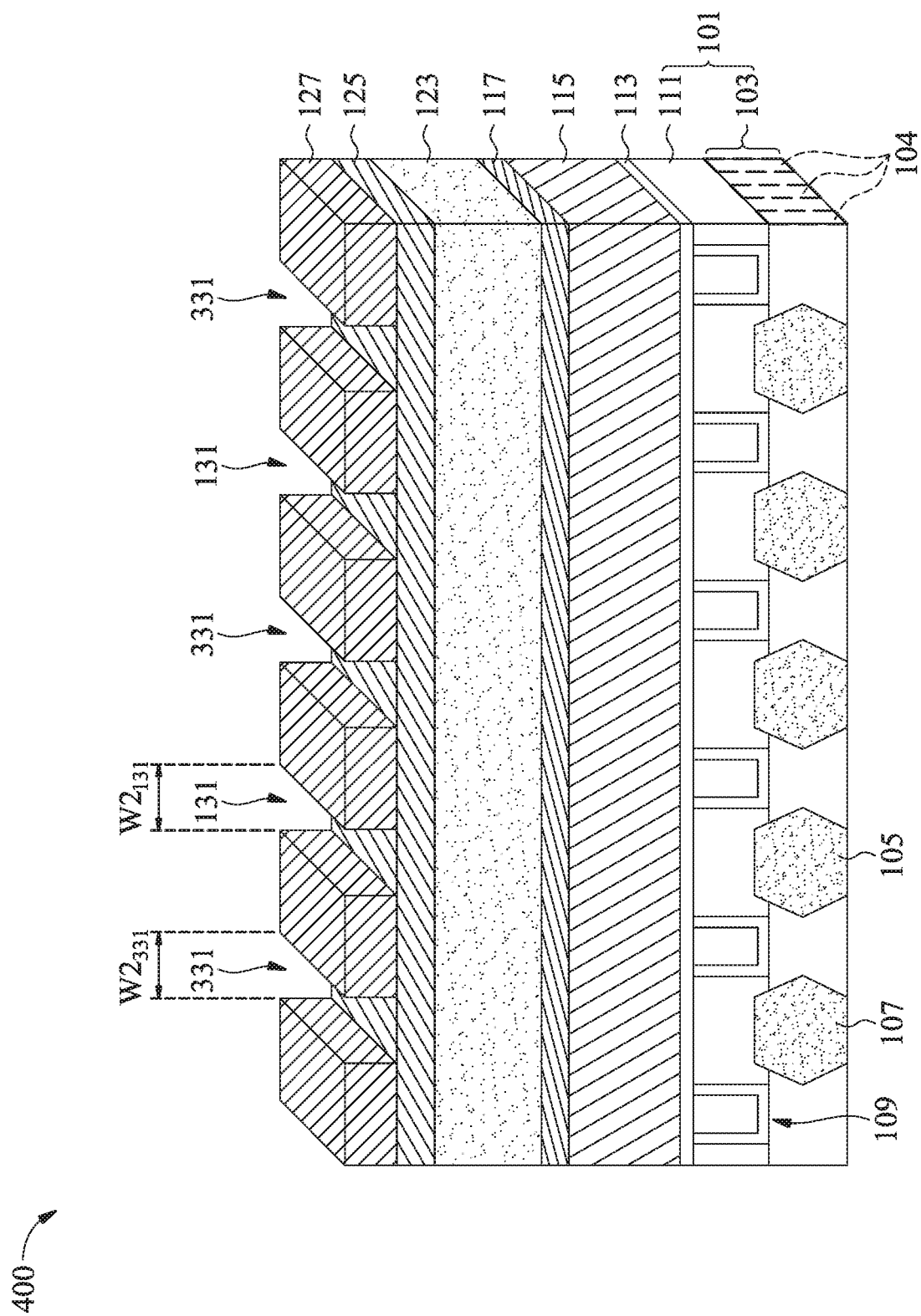
FIGS. 4A-4B illustrate the second patterning of a first middle layer of the tetra-layer photoresist in accordance with some embodiments.
Figure 4B:
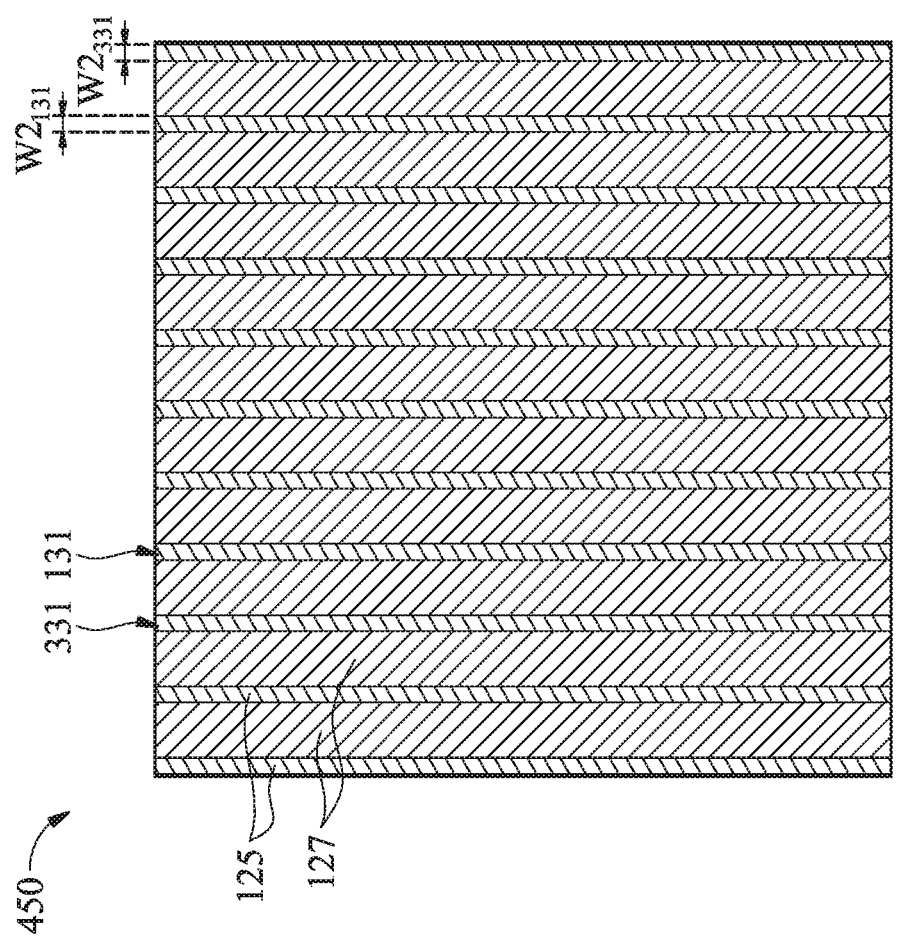

FIGS. 4A-4B illustrate a transferring of the pattern of the second photoresist layer 329 into the remaining portions of the first middle layer 127 in a second etching process. The first middle layer 127 has a high etching selectivity relative to the second photoresist layer 329 and the second middle layer 125. In an embodiment, the second photoresist layer 329 is used as an etching mask for a second patterning of the remaining portions of the first middle layer 127. In some embodiments, the second etching process may be the same as the first etching process used to transfer the pattern of the first photoresist layer 129 into the first middle layer 127. In some embodiments, the second etching process may be an anisotropic etching process, so that the second slot openings 331 in the second photoresist layer 329 are extended through the first middle layer 127. However, any suitable etching process may be used for the second etching process. According to an embodiment, the second slot openings 331 in the first middle layer 127 may have a second width $W2_{331}$ that is about the same size as the second width $W2_{131}$ of the first slot openings 131 in the first middle layer 127. In other embodiments, the second width $W2_{331}$ of the second slot openings 331 in the first middle layer 127 may be different from the second width $W2_{131}$ of the first slot openings 131 in the first middle layer 127.

As the pattern of the second photoresist layer 329 is transferred into the remaining portions of the first middle layer 127, the sizes and characteristics of the second slot openings 331 in the second photoresist layer 329 are transferred into the sizes and characteristics of the second slot openings 331 in the first middle layer 127. As such, depending on the characteristics of the second slot openings 331 in the second photoresist layer 329, in some embodiments the second slot openings 331 in the first middle layer 127 may have the same second widths $W2_{331}$. In other embodiments, the second widths $W2_{331}$ of the second slot openings 331 in the first middle layer 127 may be different from one another. According to some embodiments, an individual second slot opening 331 in the first middle layer 127 may have more than one width.

In an embodiment, the second slot openings 331 may have about the same sizes (or are slightly smaller) in the remaining portions of the first middle layer 127 as they do in the second photoresist layer 329. In other embodiments, the second width $W2_{331}$ may be different from the first width $W1_{331}$, for example, due to critical dimension (CD) shrinkage. According to an embodiment, the second width $W2_{331}$ of the second slot openings 331 in the remaining portions of the first middle layer 127 may be between about 6 nm and about 12 nm, such as about 9 nm. However, any suitable width may be used.

As seen in the top view 450 of the fourth intermediate structure 400 in FIG. 4B, a series of the second slot openings 331 expose second surfaces of the second middle layer 125 through the still further remaining portions of the first middle layer 127 alongside the exposed first surfaces of the second middle layer 125. In an embodiment, wherein the patterned second photoresist layer 329 with the second slot openings 331 is an overlap shift of the patterned first photoresist layer 129, the first exposed surfaces of second middle layer 125 alternate in series with the second exposed surfaces of the second middle layer 125 between the still further remaining portions of the first middle layer 127. The still further remaining portions of the first middle layer 127 may define and serve as a mask layer (e.g., first slot pattern) used to pattern the second middle layer 125.

Figure 5A:
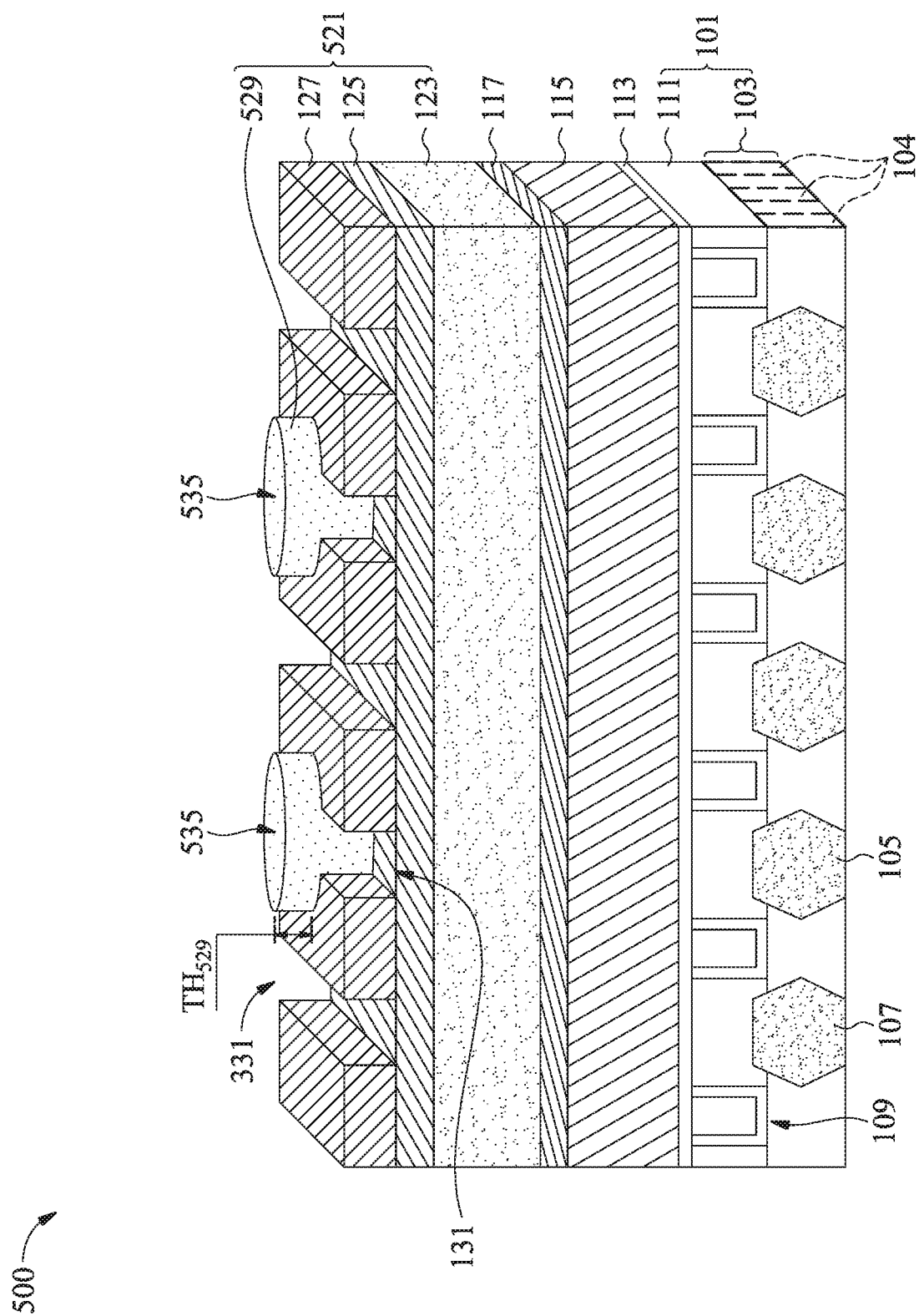
FIGS. 5A-5B illustrate the deposition and patterning of a second photoresist layer over a second middle layer of a tetra-layer photoresist in accordance with some embodiments.
Figure 5B:
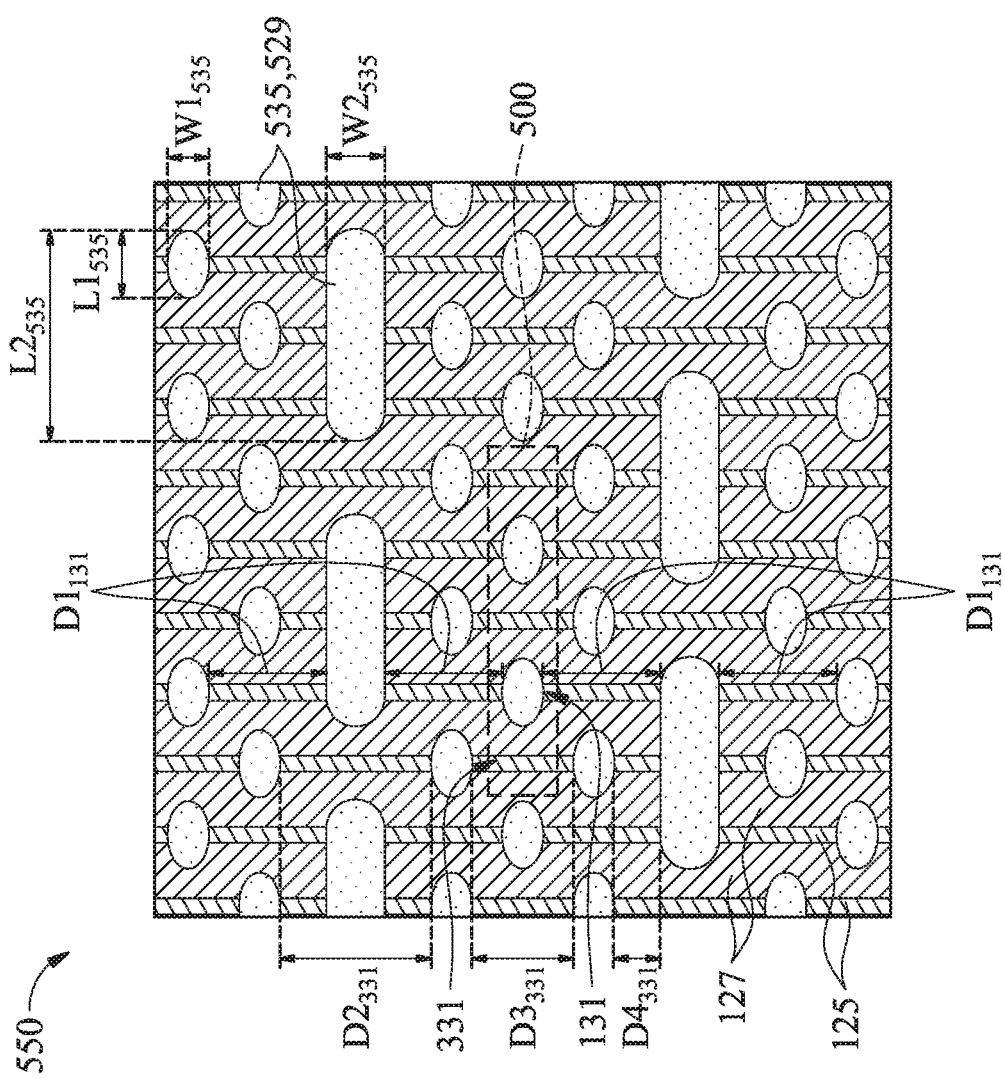

FIGS. 5A-5B illustrate a deposition of a third photoresist layer 529 over the patterned first middle layer 127 and filling first and second exposed portions of the second middle layer 125 between the first slot openings 131 and the second slot openings 331 in the first middle layer 127. As such, the bottom layer 123, the second middle layer 125, the first middle layer 127 and the third photoresist layer 529 together form a third tetra-layer photoresist 521. In some embodiments, the materials and processes used to deposit the third photoresist layer 529 may be the same as those used to deposit the first photoresist layer 129, as described above. For example, a spin-on process, or the like, may be used to deposit a photosensitive material as the third photoresist layer 529 over the patterned first middle layer 127. However, any suitable materials and processes may be used to deposit the third photoresist layer 529.

In some embodiments, the third photoresist layer 529 may have the same thickness as that of the first photoresist layer 129. In other embodiments, the third photoresist layer 529 may have a different thickness from the thickness of the first photoresist layer 129. In an embodiment, the third photoresist layer 529 has a thickness $Th_{529}$ of between about 30 nm and about 100 nm, such as about 50 nm. However, any suitable thickness of the third photoresist layer 529 may be used.

FIGS. 5A-5B further illustrate a patterning of the third photoresist layer 529 to form a cut mask over the patterned first middle layer 127. The area enclosed by the dashed rectangle in FIG. 5B is a representative portion of the top view 550 corresponding to the section of the fifth intermediate structure 500 illustrated in FIG. 5A. The patterning of the third photoresist layer 529 may be performed using any suitable photolithography processes. For example, the patterning stages of third photoresist layer 529 may be similar to the patterning stages of the first tetra-layer photoresist 121 or of the second tetra-layer photoresist 321, as described above.

In some embodiments, a plurality of cut metal-to-source/drain (MD) photoresist portions 535 (e.g., photoresist cut islands) may span across and fill a portion of one or more of the series of first slot openings 131 and the series of second slot openings 331 between one or more adjacent remaining portions of the first middle layer 127. Accordingly, cut MD photoresist portions 535 fill portions of the first slot openings 131 in the first middle layer 127 and fill portions of the second slot openings 331 in the first middle layer 127. Although only two cut MD photoresist portions 535 are illustrated in FIG. 5A, a plurality of cut MD photoresist portions 535 may be disposed in a plurality of areas along surfaces of the remaining portions of the first middle layer 127 (e.g., cut pattern), as illustrated, for example, in the top view 550 of the fifth intermediate structure 500 of FIG. 5B.

In some embodiments, cut MD photoresist portions 535 may have the same lengths and same widths. In other embodiments, cut MD photoresist portions 535 may have different lengths and different widths. In some embodiments, a first plurality of cut MD photoresist portions 535 may have first lengths $L1_{535}$ and first widths $W1_{535}$ and a second plurality of cut MD photoresist portions 535 may have second lengths $L2_{535}$ and second widths $W2_{535}$. In an embodiment, the first lengths $L1_{535}$ may be between about 40 nm and about 70 nm, such as about 50 nm and the first widths $W1_{535}$ may be between about 25 nm and about 40 nm, such as about 30 nm. In an embodiment, the second lengths $L2_{535}$ may be between about 120 nm and about 200 nm, such as about 150 nm and the second widths $W2_{535}$ may be between about 30 nm and about 50 nm, such as about 40 nm. However, any suitable lengths and widths of the cut MD photoresist portions 535 may be used.

Furthermore, although the cut MD photoresist portions 535 illustrated in FIG. 5A only cover an area over a portion of one of the first slot openings 131, individual cut MD photoresist portions 535 may cover an area over more than one portion of the first slot openings 131, one portion of the second slot openings 331, or combinations thereof, as also illustrated, for example, in the top view 550 of the fifth intermediate structure 500 of FIG. 5B. However, the plurality of cut MD photoresist portions 535 (e.g., cut pattern) may cover any portions of the first slot openings 131 in the first middle layer 127 and any portions of the second slot openings 331 in the first middle layer 127 suitable for being transferred into the bottom layer 123, as desired.

In some embodiments, a first plurality of cut MD photoresist portions 535 may be spaced apart a same first distance $D1_{131}$ along the first slot openings 131. In an embodiment, the same first distance $D1_{131}$ along the first slot openings 131 may be between about 80 nm and about 120 nm, such as about 90 nm. In some embodiments, a second plurality of cut MD photoresist portions 535 may be spaced apart at different distances along the second slot openings 331. For example, the second plurality of cut MD photoresist portions 535 may be spaced apart a second distance $D2_{331}$, a third distance $D3_{331}$, and a fourth distance $D4_{331}$. In some embodiments, the second distance $D2_{331}$ between cut MD photoresist portions 535 along the second slot openings 331 may be between about 90 nm and about 150 nm, such as about 120 nm; the third distance $D3_{331}$ between cut MD photoresist portions 535 along the second slot openings 331 may be between about 60 nm and about 100 nm, such as about 70 nm; and the fourth distance $D4_{331}$ between cut MD photoresist portions 535 along the second slot openings 331 may be between about 30 nm and about 60 nm, such as about 40 nm.

Figure 6A:
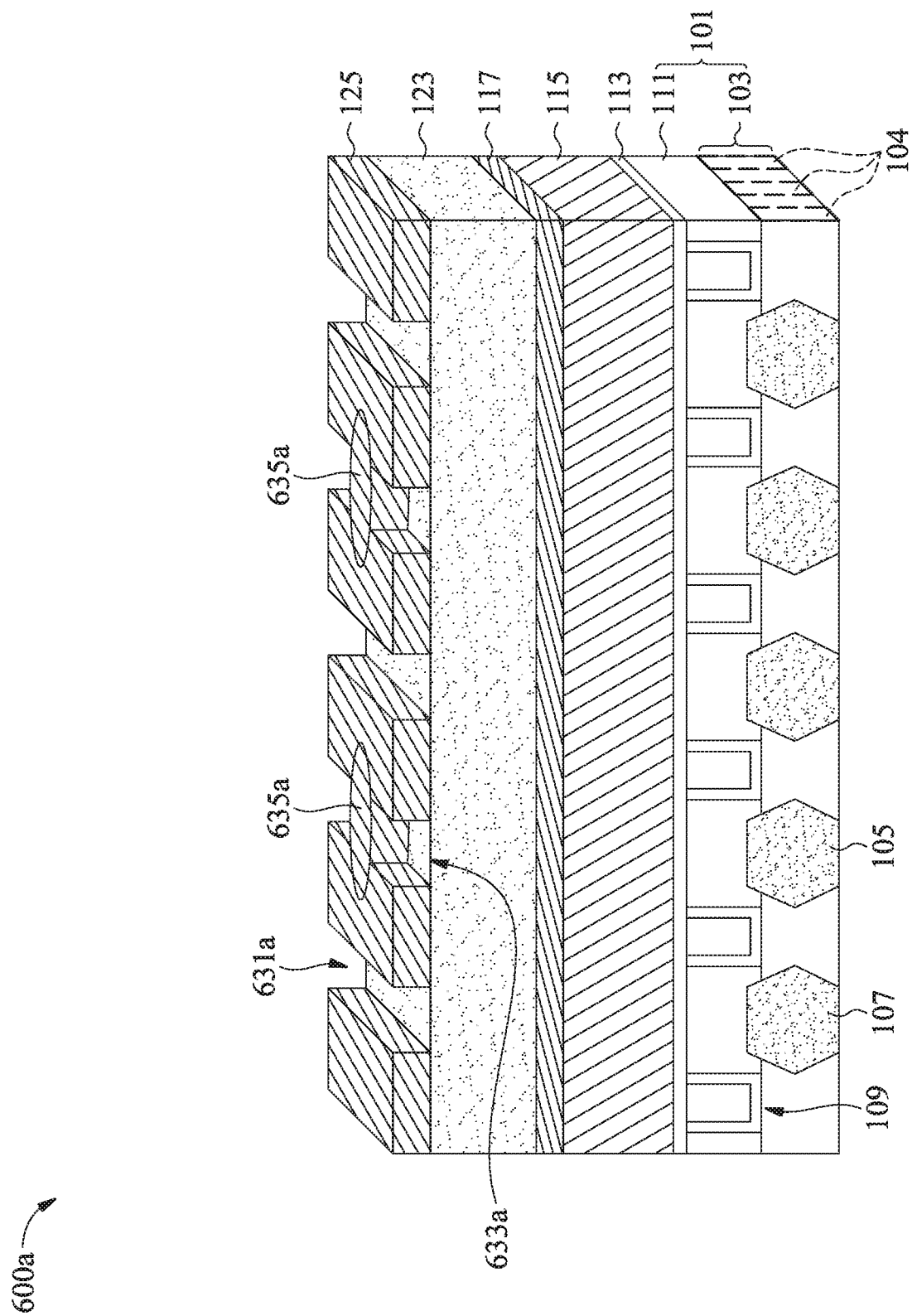
FIGS. 6A-6D illustrate the transfer of a pattern of the second photoresist into a bottom layer of the tetra-layer photoresist and patterning of the second middle layer and bottom layer of the tetra-layer photoresist in accordance with some embodiments.
Figure 6B:
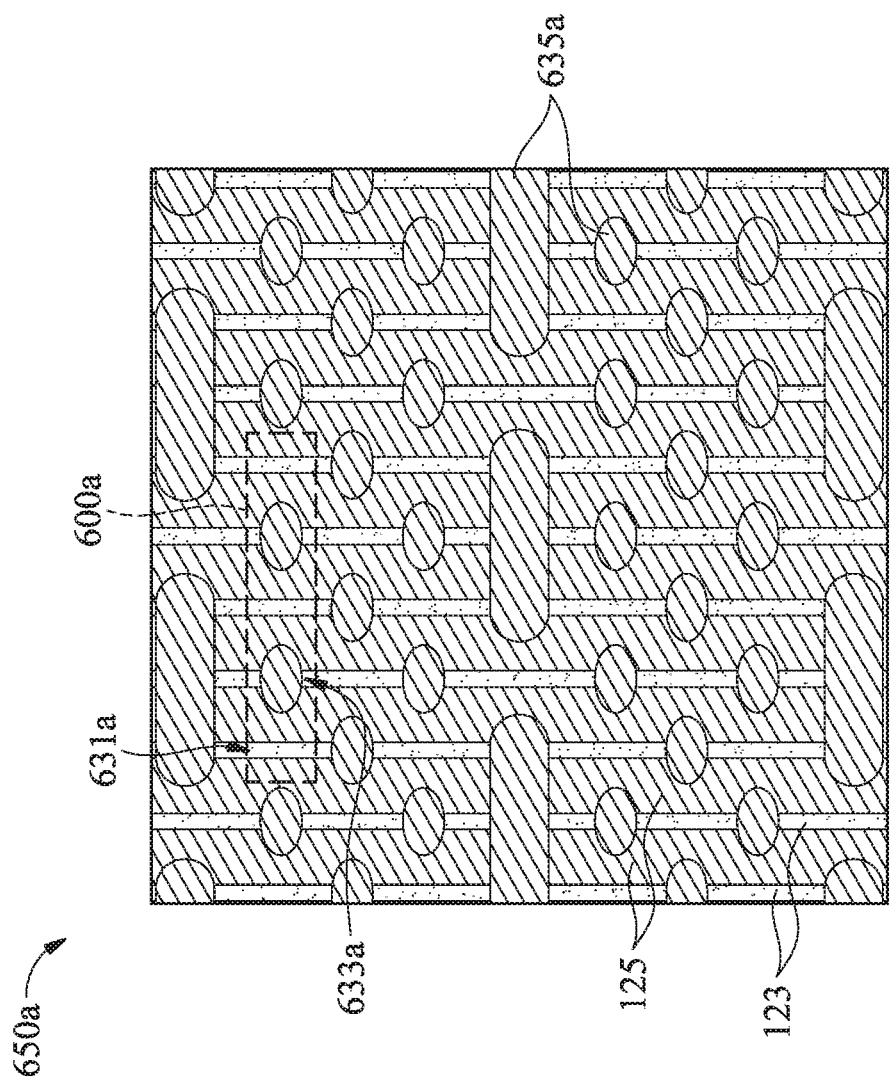

FIGS. 6A-6B illustrate the transferring of the pattern of the remaining portions of the first middle layer 127 and the plurality of cut MD photoresist portions 535 into portions of the second middle layer 125 in a third etching process. In an embodiment of the third etching process, the second middle layer 125 has a high etching selectivity relative to the first middle layer 127, the cut mask formed from the third photoresist layer 529 and the bottom layer 123. In an embodiment, the pattern of the first middle layer 127 and the cut mask formed from the third photoresist layer 529 are used as an etching mask for patterning the second middle layer 125 in an initial etching step of the third etching process. Once the second middle layer 125 has been patterned, remaining portions of the cut mask 535 of the third photoresist layer 529 and remaining portions of the first middle layer 127, illustrated in FIGS. 5A-5B, may be removed to form a sixth intermediate structure 600a, as illustrated in FIG. 6A.

FIGS. 6A-6B further illustrate the patterning of the second middle layer 125 to form a cut mask over the bottom layer 123. The area enclosed by the dashed rectangle in FIG. 6B is a representative portion of the top view 650a corresponding to the section of the sixth intermediate structure 600a illustrated in FIG. 6A. Exposed portions of the bottom layer 123 appear within first openings 633a and the second openings 631a disposed between remaining portions of the second middle layer 125 that are not covered by the plurality of cut MD portions 635a patterned into the second middle layer 125. The corresponding portions of the second middle layer 125 may be removed using one or more etching processes which may be performed using any suitable photolithography processes.

According to some embodiments, the etching processes used to pattern the second middle layer 125 may be anisotropic, so that the first slot openings 131 and the second slot openings 331 between remaining portions of the first middle layer 127 are extended through the second middle layer 125. As such, first openings 633a and second openings 631a are formed between remaining portions of the second middle layer 125 and the remaining portions of the second middle layer 125 are integrally formed with cut MD pattern transfers 635a within the second middle layer 125. Thus, the first openings 633a and the second openings 631a of the second middle layer 125 have about the same sizes (or are slightly smaller) in the second middle layer 125 as they do in the first middle layer 127. The resulting intermediate structure 600a is illustrated in FIGS. 6A and 6B with the cut MD pattern transfers 635a of FIG. 6A shown with a contrasting pattern to that of the remaining portions of the second middle layer 125 between the first openings 633a and the second openings 631a. This contrasting pattern of the cut MD pattern transfers 635a is merely intended to aid in the visual perception of the pattern formed in the second middle layer 125.

In some embodiments, the etching process used to pattern the second middle layer 125 may include a dry etching process having a high etching selectivity of the second middle layer 125 relative to the first middle layer 127, the plurality of cut MD photoresist portions 535 and the bottom layer 123. For example, the etching process may include a plasma etching process. In some embodiments, the plasma etching process may include an inductively-coupled plasma generated with a power between about 100 Watts and about 800 Watts and may be performed at a pressure between about 10 mTorr and about 100 mTorr. In some embodiments, the plasma etching process may use $Cl_2$, HBr, a fluorine-based process gas such as $CF_4$, $CH_2F_2$, $CHF_3$, or another type of process gas. In some embodiments, the etching method may be selected from a Reactive Ion Etching (RIE) process (such as ICP or CCP), or the like. The process gases may include an etching gas(es) and a polymer-forming gas(es). In accordance with some embodiments, for example, when the second middle layer 125 comprises silicon oxide, the etching gas may include a fluorine-containing gas such as $CF_4$, $NF_3$, or combinations thereof. The polymer-forming gas may include $CHF_3$, $CH_2F_2$, $CH_3F$, $C_4F_6$, $C_4F_8$, or the combinations thereof. The pressure of the process gases may be in the range between about 5 mt and about 200 mt. The temperature of intermediate structure 500 during the etching of the second middle layer 125 may be in the range between about 0° C. and about 50° C. However, any other suitable process gases or etching techniques may be used in other embodiments. In some cases, during the etching of the second middle layer 125, the cut MD photoresist portions 535 and the first middle layer 127 may be consumed. Once the pattern of the first slot openings 131 and the second slot openings 331 and the cut MD photoresist portions 535 has been transferred into the second middle layer 125, any still further remaining portions of the cut MD photoresist portions 535, any still further remaining portions of the first middle layer 127 may be removed exposing the remaining portions of the second middle layer 125 and the cut MD pattern transfers 635a of the second middle layer 125. Once patterned, the second middle layer 125 may serve as an etch mask (e.g., cut mask) in a subsequent etching step of the third etching process in order to transfer the pattern of the second middle layer 125 into the bottom layer 123.

Figure 6C:
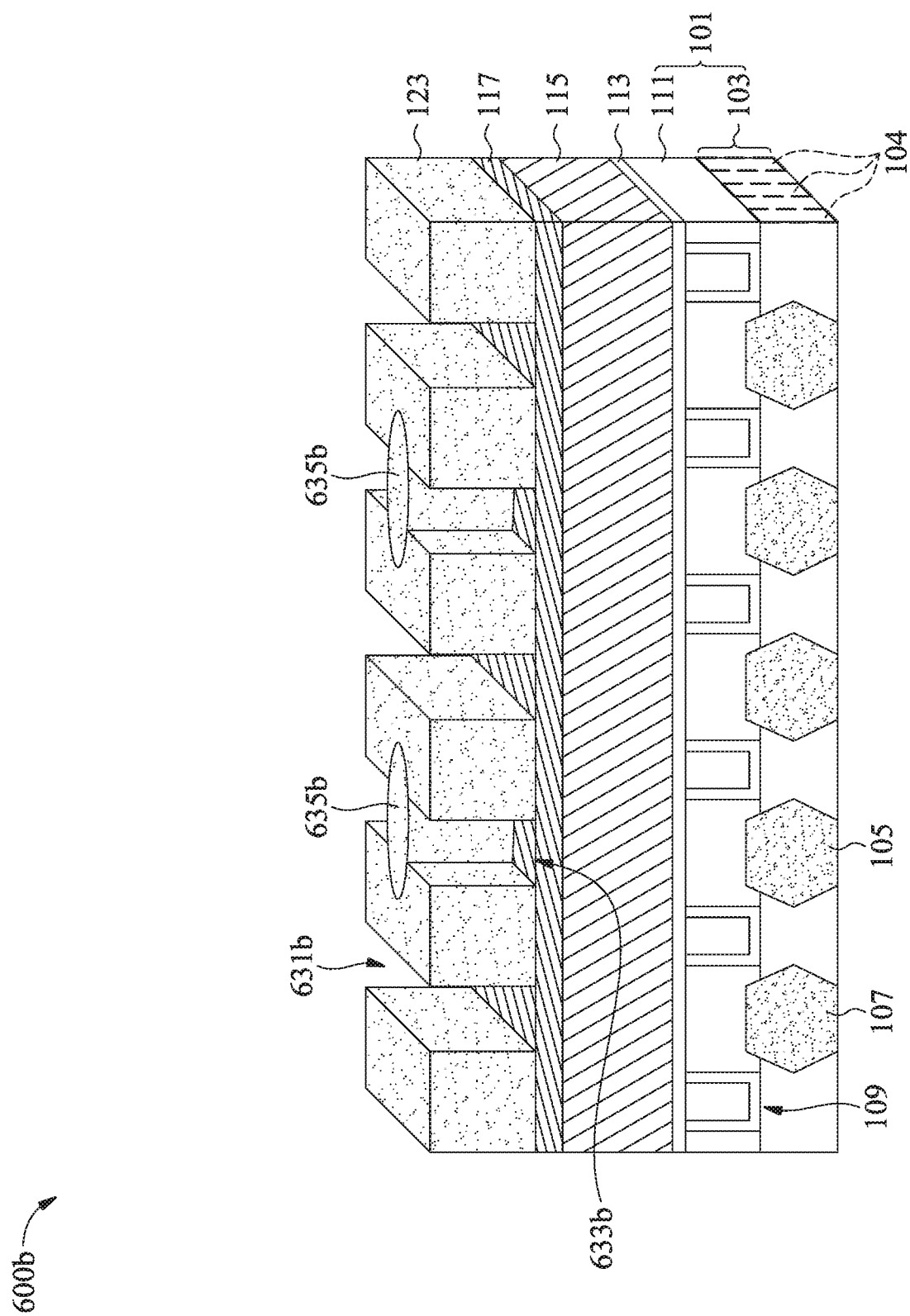
Figure 6D:
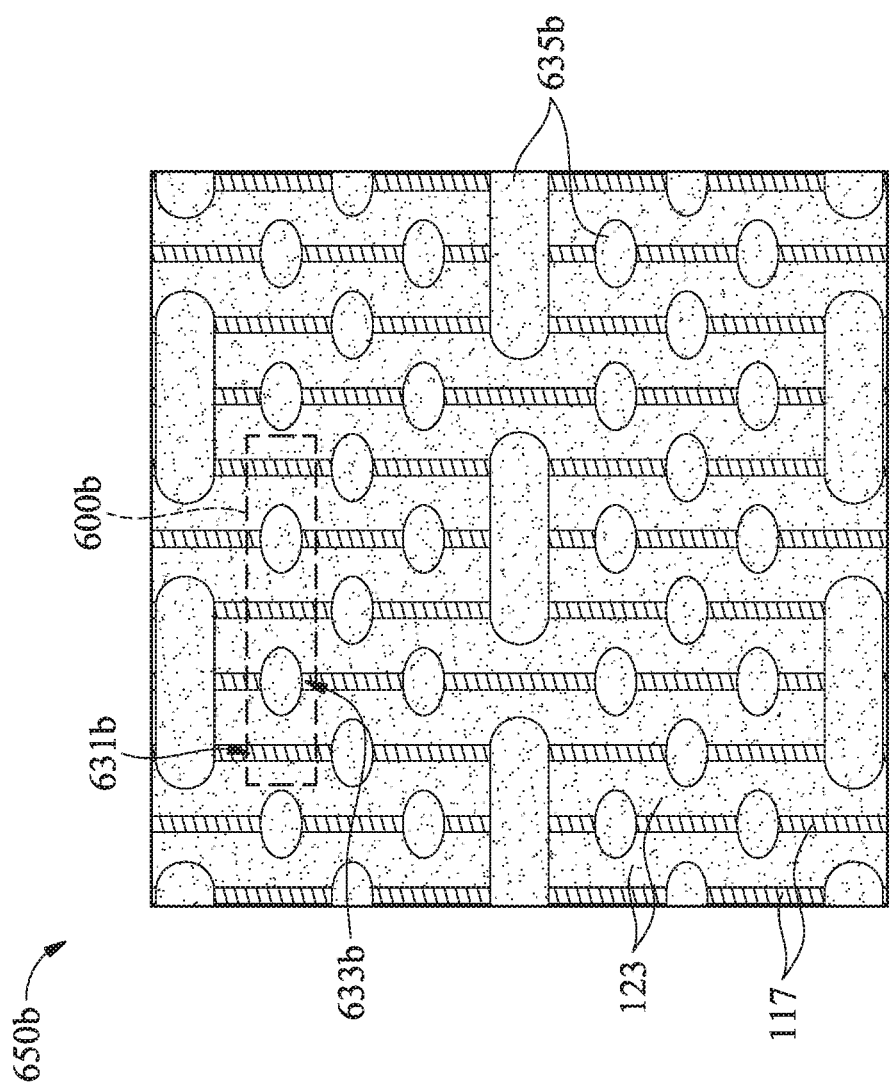

FIGS. 6C-6D illustrate the transferring of the pattern formed in the second middle layer 125 into corresponding portions of the bottom layer 123 in a subsequent etching step of the third etching process. In an embodiment of the subsequent step of the third etching process, the bottom layer 123 has a high etching selectivity relative to the second middle layer 125 and the hard mask layer 117. In an embodiment, the pattern of the second middle layer 125 is used as an etching mask for patterning the bottom layer 123 in the subsequent etching step of the third etching process. Once the bottom layer 123 has been patterned, remaining portions of the second middle layer 125, illustrated in FIGS. 6A-6B, may be removed to form a resulting intermediate structure 600b, as illustrated in FIG. 6C.

FIGS. 6C-6D further illustrate a patterning of the bottom layer 123 to form a cut mask over the hard mask layer 117. The area enclosed by the dashed rectangle in FIG. 6D is a representative portion of the top view 650b corresponding to the section of the resulting intermediate structure 600b illustrated in FIG. 6C. Portions of the bottom layer 123 that are exposed, within the first openings 633a and the second openings 631a between remaining portions of the second middle layer 125 and that are not covered by the plurality of cut MD pattern transfers 635a that are integrally formed with the remaining portions of the second middle layer 125, may be removed using one or more etching processes. The patterning of the bottom layer 123 may be performed using any suitable photolithography processes.

According to some embodiments, the etching processes used to pattern the bottom layer 123 may be anisotropic, so that the first openings 633a and the second openings 631a between remaining portions of the second middle layer 125 are extended through the bottom layer 123. As such, first openings 631b and second openings 633b are formed between remaining portions of the bottom layer 123 and the remaining portions of the bottom layer 123 are integrally formed with cut MD pattern transfers 635b within the bottom layer 123. Thus, the first openings 633b and the second openings 631b of the bottom layer 123 have about the same sizes (or are slightly smaller) in the bottom layer 123 as they do in the second middle layer 125. The resulting intermediate structure 600b is illustrated in FIGS. 6C and 6D with the cut MD pattern transfers 635b of FIG. 6C shown with a contrasting pattern to that of the remaining portions of the bottom layer 123 between the first openings 633b and the second openings 631b. This contrasting pattern of the cut MD pattern transfers 635b is merely intended to aid in the visual perception of the pattern formed in the bottom layer 123.

In some embodiments, the etching process used to pattern the bottom layer 123 may include a dry etching process having a high etching selectivity of the bottom layer 123 relative to the second middle layer 125 and the hard mask layer 117. For example, the etching process may include a plasma etching process. In some embodiments, the plasma etching process may include an inductively-coupled plasma generated with a power between about 100 Watts and about 800 Watts and may be performed at a pressure between about 10 mTorr and about 100 mTorr. In some embodiments, the plasma etching process may use $Cl_2$, HBr, a fluorine-based process gas such as $CF_4$, $CH_2F_2$, $CHF_3$, or another type of process gas. In some embodiments, the etching method may be selected from a Reactive Ion Etching (RIE) process (such as ICP or CCP), or the like. The process gases may include an etching gas(es) and a polymer-forming gas(es). In accordance with some embodiments, for example, when the bottom layer 123 comprises silicon oxide, the etching gas may include a fluorine-containing gas such as $CF_4$, $NF_3$, or combinations thereof. The polymer-forming gas may include $CHF_3$, $CH_2F_2$, $CH_3F$, $C_4F_6$, $C_4F_8$, or the combinations thereof. The pressure of the process gases may be in the range between about 5 mt and about 200 mt. The temperature of intermediate structure 600a during the etching may be in the range between about 0° C. and about 50° C. However, any other suitable process gases or etching techniques may be used in other embodiments. In some cases, during the subsequent etching step of the third etching process, the second middle layer 125 may be consumed. Once the first openings 633b and the second openings 631b of the bottom layer 123 have been formed, remaining portions of the second middle layer 125 may be removed exposing remaining portions of the bottom layer 123 and cut MD pattern transfers 635b of the bottom layer 123.

Although embodiments have been discussed and illustrated with regards to the third etching process for patterning the second middle layer 125 and the bottom layer 123 in separate etching steps of the third etching process, these embodiments are not intended to be limiting. Other embodiments of the third etching process may include patterning of the second middle layer 125 and the bottom layer 123 together in a single etching step. For example, in the third etching process, the second middle layer 125 and the bottom layer 123 may have a high etching selectivity relative to the first middle layer 127, the cut MD photoresist portions 535 and the hard mask layer 117. As such, the hard mask layer 117 may serve as a stop layer for etching the second middle layer 125 and the bottom layer 123 and for transferring the pattern of the first middle layer 127 and the cut MD photoresist portions 535 into the second middle layer 125 and the bottom layer 123 in a single etching step. In some embodiments, the first middle layer 127, the cut MD photoresist portions 535 may be consumed during the single etching step. Once the bottom layer 123 has been patterned, a subsequent removal of the patterned second middle layer 125 may be performed to expose the remaining portions of the patterned bottom layer 123. As such, the patterned bottom layer 123 may serve as a mask for transferring the pattern of the bottom layer 123 into the hard mask layer 117. All such embodiments are considered to be within the intended scope of the embodiments.

Figure 7A:
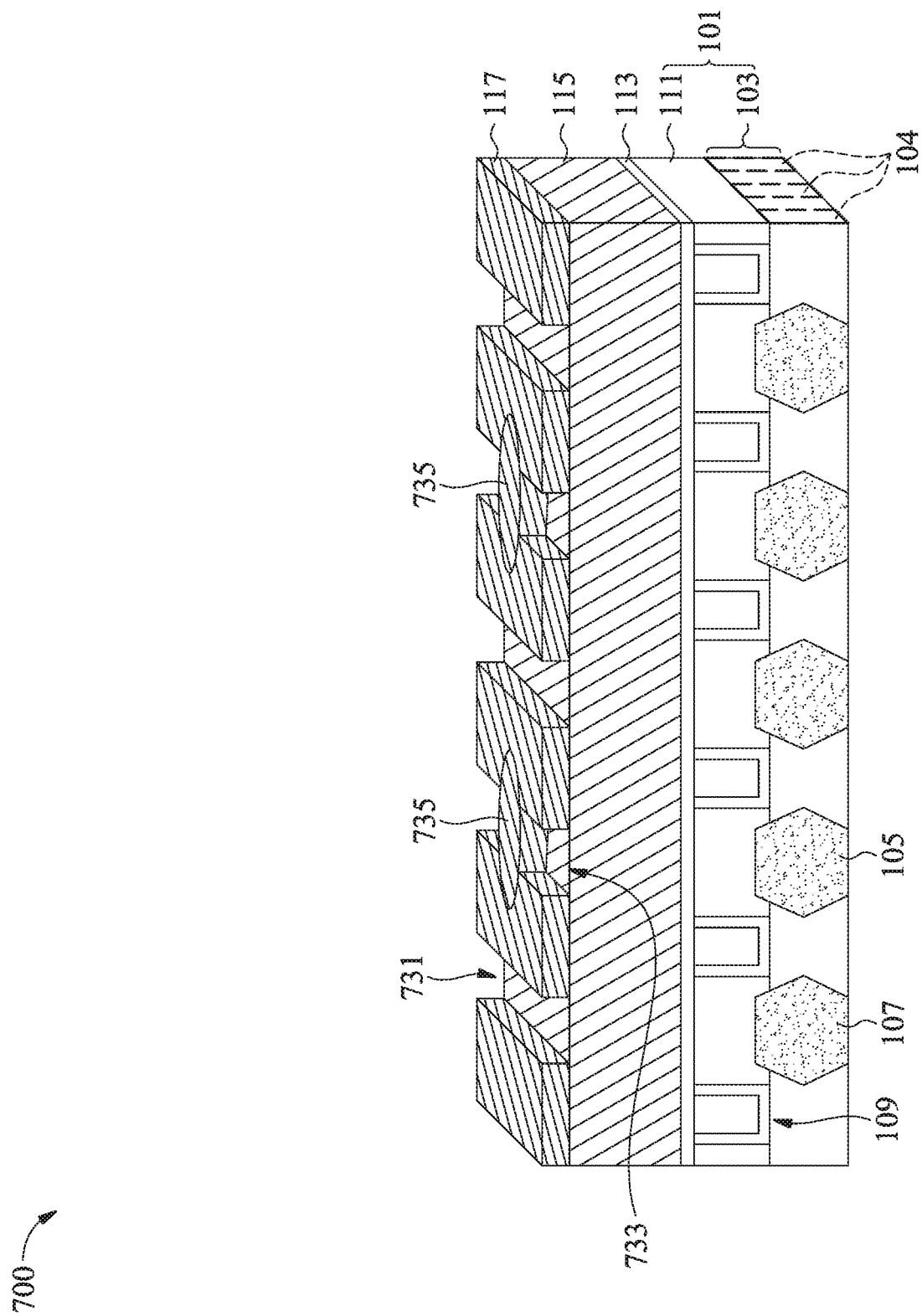
FIGS. 7A-7B illustrate the transfer of the pattern from the bottom layer into a hard mask layer of the tetra-layer photoresist and patterning of the hard mask layer in accordance with some embodiments.
Figure 7B:
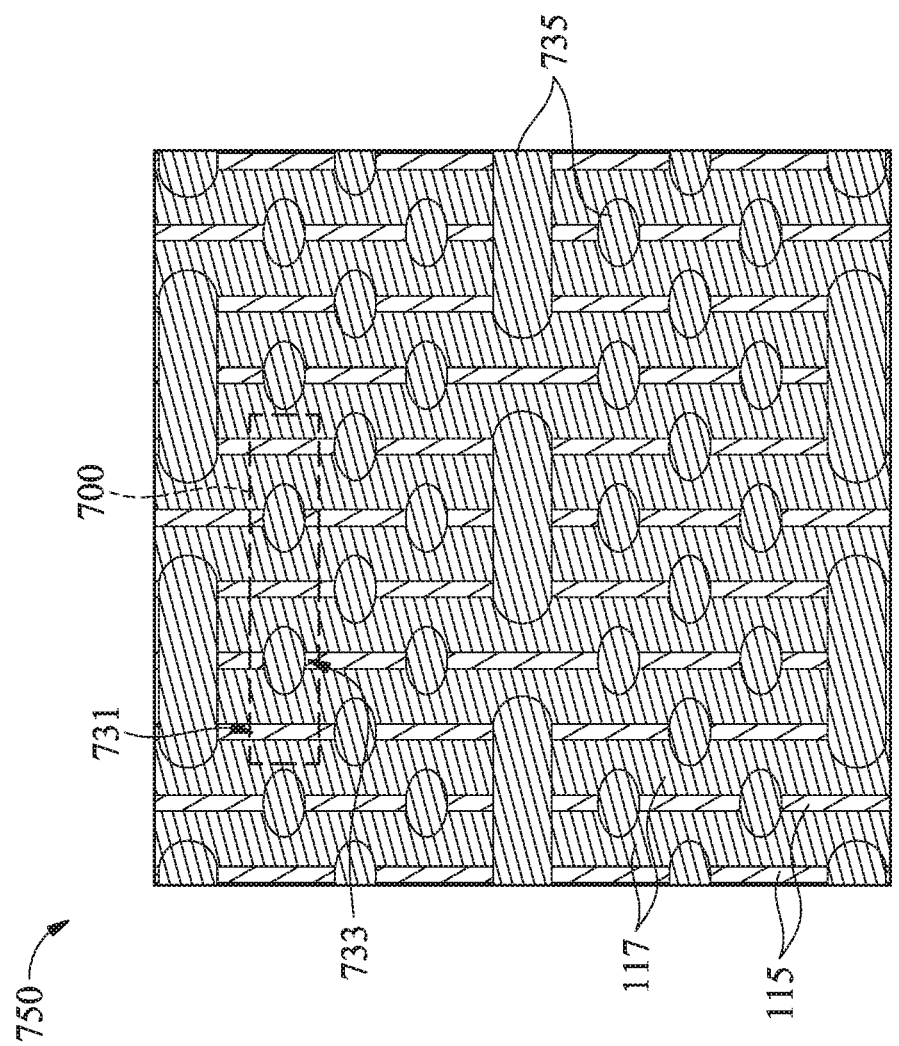

FIGS. 7A-7B illustrate the transferring of the first openings 631, the second openings 633 and the cut MD pattern transfers 635 within the bottom layer 123 into the hard mask layer 117 in order to form first openings 731, second openings 733, and cut MD pattern transfers 735 within the hard mask layer 117. FIGS. 7A-7B further illustrate a patterning of the hard mask layer 117 to form a cut mask over the target layer 115. The area enclosed by the dashed rectangle in FIG. 7B is a representative portion of the top view 750 corresponding to the section of the seventh intermediate structure 700 illustrated in FIG. 7A.

As shown in FIG. 7A, a fourth etching process may be performed to transfer the pattern of the bottom layer 123 into the hard mask layer 117, thereby extending the first openings 631 and second openings 633 of the bottom layer 123 through the hard mask layer 117. The fourth etching process of the hard mask layer 117 may be anisotropic, so that the first openings 631 and second openings 633 of the bottom layer 123 are extended through the hard mask layer 117. As such, the first openings 731 and the second openings 733 are formed between remaining portions of the bottom layer 123 and the remaining portions of the bottom layer 123 are integrally formed with cut MD pattern transfers 735 within the hard mask layer 117. Accordingly, the first openings 731 and the second openings 733 of the hard mask layer 117 have about the same sizes (or are slightly smaller) in the hard mask layer 117 as the first openings 631 and second openings 633 have in the bottom layer 123. The seventh intermediate structure 700 is illustrated in FIGS. 7A and 7B with the cut MD pattern transfers 735 of FIG. 7A shown with a contrasting pattern to that of the remaining portions of the hard mask layer 117 between the first openings 731 and the second openings 733 of the hard mask layer 117. This contrasting pattern of the cut MD pattern transfers 735 is merely intended to aid in the visual perception of the pattern formed in the hard mask layer 117.

As part of etching the hard mask layer 117, the bottom layer 123 may be consumed. In some embodiments when the patterned bottom layer 123 is not completely consumed while etching the hard mask layer 117, an ashing process may be performed to remove remaining residue of the bottom layer 123. Once the bottom layer 123 has been removed, portions of the hard mask layer 117 previously covered by the bottom layer 123 are exposed. The hard mask layer 117 is then used as an etching mask for etching the target layer 115, in which the pattern of the hard mask layer 117 is transferred to the target layer 115.

As shown in FIG. 7B, the regions of the target layer 115 that are exposed through first openings 731 and second openings 733 of the hard mask layer 117 may define regions in which contacts are formed in the target layer 115. The exposed portions of the hard mask layer 117 may define where cuts are located between the contacts subsequently formed in the target layer 115. Once patterned, the remaining portions of the hard mask layer 117 may be used as an etching mask to form contact openings from the underlying target layer 115 to the source regions 105 and to the drain regions 107 of the semiconductor structure 101. As such, the first openings 731, the second openings 733 and the cut MD pattern transfers 735 of the etching mask formed in the hard mask layer 117 may be transferred into the target layer 115 and the semiconductor structure 101 to form the contact openings.

Figure 8A:
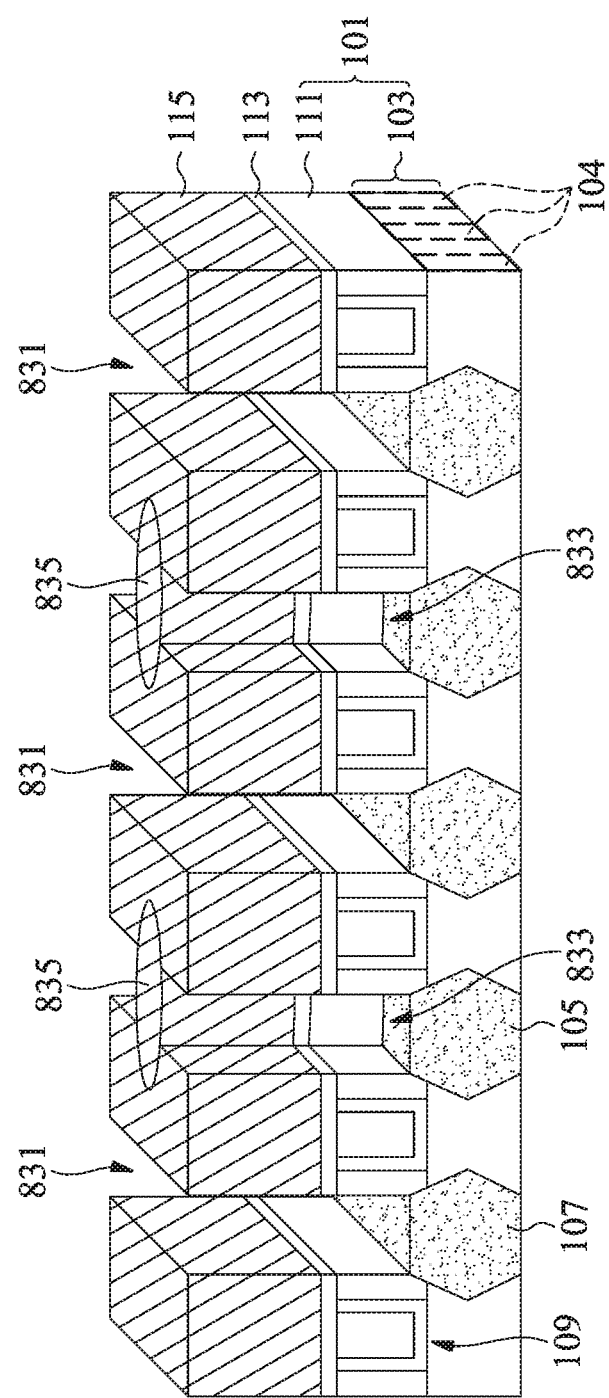
FIGS. 8A-8B illustrate the transfer of the pattern from the hard mask layer into a target layer and patterning of the target layer in accordance with some embodiments.
Figure 8B:
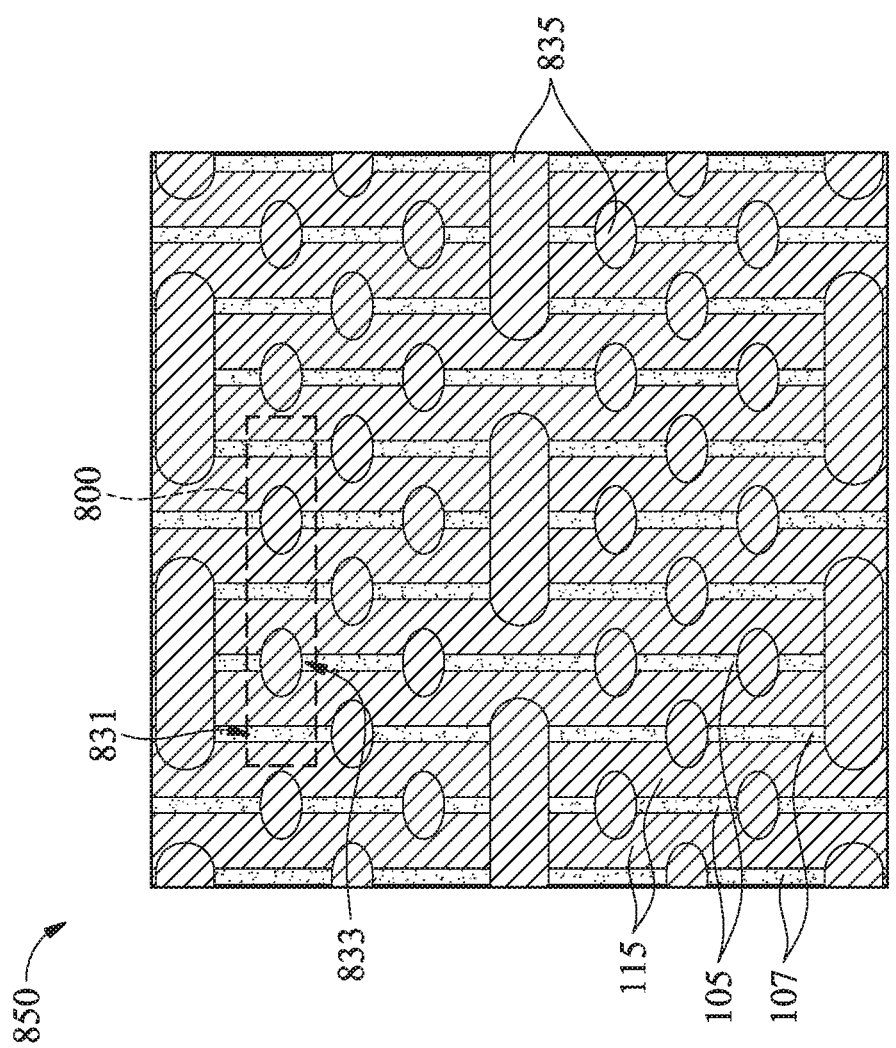

FIGS. 8A-8B illustrate, according to some embodiments, a fifth etching process performed using the patterned hard mask layer 117 as the etching mask to transfer the first openings 731, the second openings 733, and the cut MD pattern transfers 735 within the hard mask layer 117 into the target layer 115, the etch stop layer 113, and the inter-layer dielectric (ILD) layer 111. FIGS. 8A-8B further illustrate a patterning of the target layer 115, the etch stop layer 113, and the inter-layer dielectric (ILD) layer 111 to form first contact openings 831 and second contact openings 833 over source/drain regions of the semiconductor structure 101.

Although embodiments have been discussed and illustrated with regards to the fifth etching step for patterning the target layer 115, the etch stop layer 113, and the inter-layer dielectric (ILD) layer 111 together in a single etching step, these embodiments are not intended to be limiting. Other embodiments of the fifth etching process may include patterning of the target layer 115, the etch stop layer 113, and the inter-layer dielectric (ILD) layer 111 in separate etching steps. All such embodiments are considered to be within the intended scope of the embodiments.

The fifth etching process used to form first contact openings 831 and second contact openings 833, in some embodiments, may be a dry etching process performed using an etching solution comprising $CF_4$, $SO_2$, a mixture of HBr, Cl, and $O_2$, a mixture of HBr, $Cl_2$, and $O_2$, or a mixture of HBr, $Cl_2$, $O_2$, and $CF_2$ etc. In other embodiments, the fifth etching process used to form the first contact openings 831 and the second contact openings 833 may be a wet etching process performed using an etching solution comprising KOH, tetramethylammonium hydroxide (TMAH), $CH_3COOH$, $NH_4OH$, $H_2O_2$, Isopropanol (IPA), or the solution of HF, $HNO_3$, and $H_2O$, for example. However, any suitable etching techniques and any suitable etching solutions, or combination thereof, may be used to form the first contact openings 831 and the second contact openings 833.

Once the first contact openings 831 and the second contact openings 833 have been formed, the remaining portions of the hard mask layer 117 may be removed. The removal of the etching mask formed from the hard mask layer 117 may be isotropic or anisotropic, and may be performed using a wet etch process or using a dry etch process. However, any suitable etching process may be used to remove remaining portions of the hard mask layer 117.

As shown in FIG. 8A, the fifth etching process may be performed to transfer the pattern of the hard mask layer 117 into the target layer 115, the etch stop layer 113, and the inter-layer dielectric (ILD) layer 111, thereby extending the first openings 731 and second openings 733 of the hard mask layer 117 through the target layer 115, the etch stop layer 113, and the inter-layer dielectric (ILD) layer 111. As such, the first contact openings 831 and the second contact openings 833 are formed between remaining portions of the target layer 115, the etch stop layer 113, and the inter-layer dielectric (ILD) layer 111 and the remaining portions of the target layer 115, the etch stop layer 113, and the inter-layer dielectric (ILD) layer 111 are integrally formed with cut MD pattern transfers 835 within the target layer 115, the etch stop layer 113, and the inter-layer dielectric (ILD) layer 111. The eighth intermediate structure 800 is illustrated in FIGS. 8A and 8B with the cut MD pattern transfers 835 of FIG. 8A shown with a contrasting pattern to that of the remaining portions of the target layer 115, the etch stop layer 113, and the inter-layer dielectric (ILD) layer 111 between the first contact openings 831 and the second contact openings 833. This contrasting pattern of the cut MD pattern transfers 835 is merely intended to aid in the visual perception of the pattern formed in the target layer 115, the etch stop layer 113, and the inter-layer dielectric (ILD) layer 111.

As shown in FIG. 8A, the first contact openings 831 and the second contact openings 833 are etched down to the source regions 105 and to the drain regions 107 to form source/drain contact openings in the of the semiconductor structure 101. The area enclosed by the dashed rectangle in FIG. 8B is a representative portion of the top view 850 corresponding to the section of the eighth intermediate structure 800, as illustrated in FIG. 8A. In an embodiment, first contact openings 831 are formed over drain regions 107 and second contact openings 833 are formed over the source regions 105.

For example, first contact openings 831 and second contact openings 833 in the target layer 115 may expose source/drain regions of a FinFET device within substrate 103 in order to form source/drain contacts for the FinFET device, and/or expose metal gate regions of a FinFET device within substrate 103 in order to form gate contacts for the FinFET device. Etching the target layer 115, the etch stop layer 113, and the inter-layer dielectric (ILD) layer 111 may include an anisotropic dry etch process and/or a wet etch process. Remaining portions of the target layer 115, the etch stop layer 113, and the inter-layer dielectric (ILD) layer 111 shown in FIGS. 8A-8B may have a same pattern as the hard mask layer 117 illustrated in FIGS. 7A-7B. As such, the target layer 115, the etch stop layer 113, and the inter-layer dielectric (ILD) layer 111 may be patterned in a single patterning step. After the first contact openings 831 and the second contact openings 833 of the target layer 115, the etch stop layer 113, and the inter-layer dielectric (ILD) layer 111 are patterned, a wet cleaning process may be performed to remove any remaining portions of the hard mask layer 117.

Figure 9A:
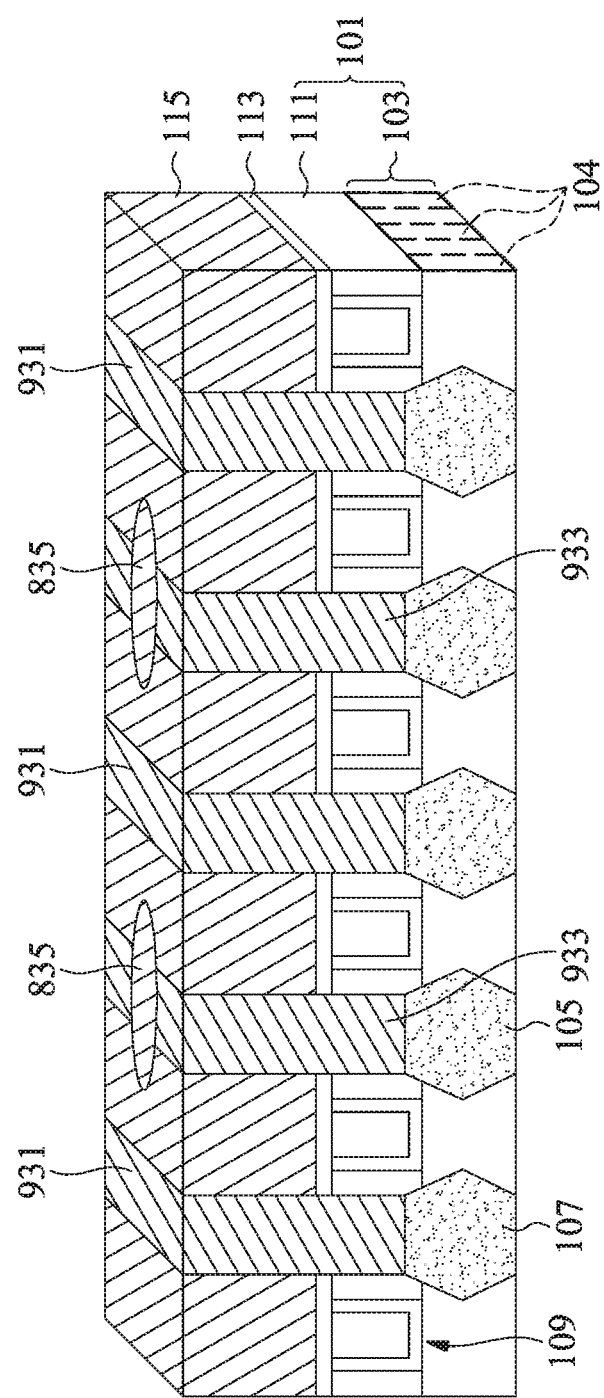
Figure 9B:
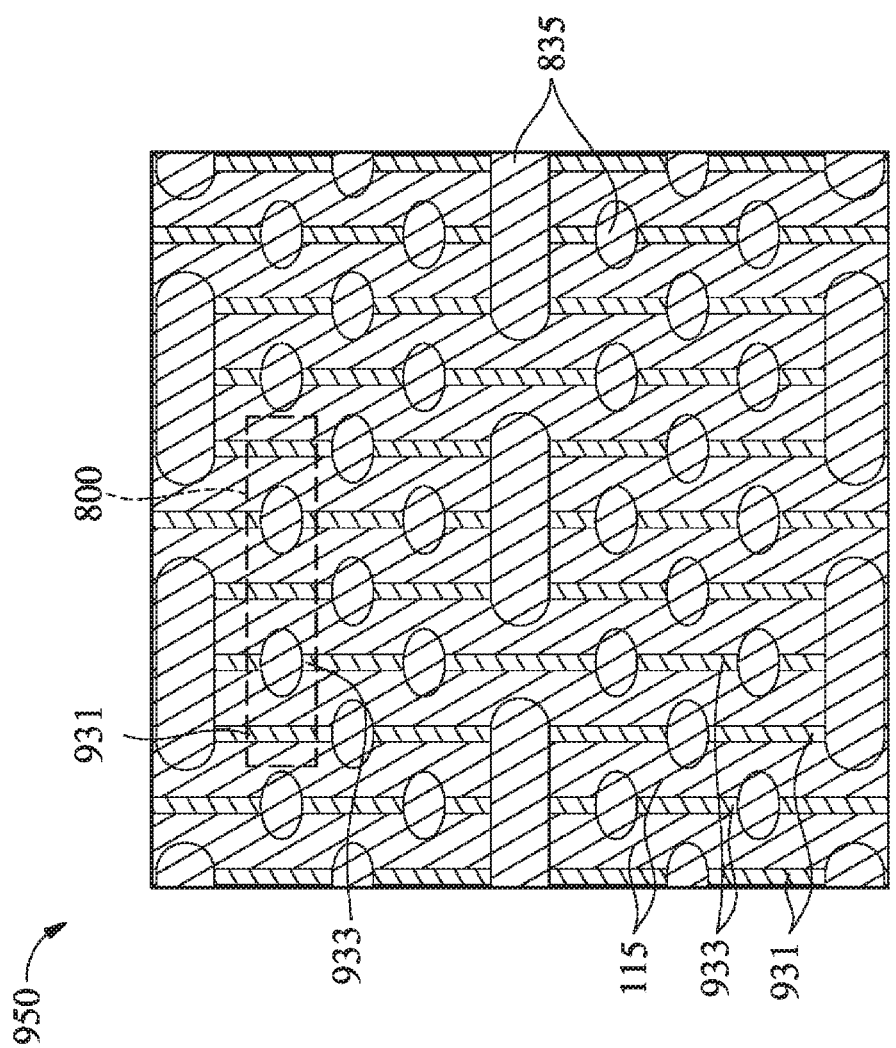

With reference to FIGS. 9A-9B, first contacts 931 may be formed in the first contact openings 831 over drain regions 107 of the patterned target layer 115 and second contacts 933 may be formed in the second contact openings 833 over source regions 105 of the patterned target layer 115, the patterned etch stop layer 113, and the patterned inter-layer dielectric (ILD) layer 111. In an embodiment, one or more liners may be formed along sidewalls and a bottom surface of the first contact openings 831 and the second contact openings 833 of the target layer 115, and a conductive material may be formed over the target layer 115. In some embodiments, silicide regions may be formed in source/drain regions exposed by the first contact openings 831 and the second contact openings 833 prior to the formation of liners. A conductive material may be initially deposited over the liners and may overfill the first contact openings 831 and the second contact openings 833 of the target layer 115. The liners may include TiO, TiN, TaO, TaN, or the like, and may provide diffusion barrier, adhesion, and/or seed layers for the contacts. The liners may be deposited using any suitable process, such as PVD, CVD, ALD, and the like. The conductive material may be a suitable conductive material such as copper, tungstun or another conductive material, and may be deposited using a process such as PVD, plating, or the like.

In embodiments, the slot MD patterning and the cut MD patterning performed to the first middle layer 127, the second middle layer 125 and transferred into the bottom layer 123 of the first tetra-layer photoresist 121, as described above with respect to FIGS. 1A-6B, may be performed as a "cut last" patterning of the first tetra-layer photoresist 121. As such, first slot openings 131 and second slot openings 331 formed in the first middle layer 127 of the first tetra-layer photoresist 121 may have a low degree of line/width/roughness (LWR) and may have little to no wiggling (e.g., MD trench wiggling) of slot profiles in the first slot openings 131 and the second slot openings 331, as described above with respect to FIGS. 2A-4B. Since there is a low degree of LWR and little to no MD trench wiggling, the slot MD patterns and the cut MD patterns are transferred into the bottom layer 123 of the tetra-layer photoresist 121, the hard mask layer 117, and ultimately the target layer 115, as described above with respect to FIGS. 5A-8B, with sharply defined profiles which leads to a lower risk of an MD-to-MG bridge forming between contacts.

In some embodiments, the patterning methods described herein may be used to form first contact openings 831 and second contact openings 833 for conductive features such as first contacts 931 and second contacts 933 (e.g., contact plugs) to be formed in the target layer 115. As described herein, a mask is used to define regions in which contacts are formed, and then another mask is used to define regions in which cuts between the contacts are formed. Because the patterning of the cut regions is performed after the patterning of the contact regions, the patterning method described herein may be considered a "cut last" process. This is in contrast to a "cut first" process, in which the patterning of the cut regions is performed first, before the patterning of the contact regions. In some cases, multiple contacts having one or more cuts may be formed to have the same dimensions or substantially the same dimensions, which allows for greater control of resistance of the contacts.

In some cases, using the first tetra-layer photoresist 121 to etch the target layer 115 can allow for improved definition of fine-pitched patterns in the target layer 115. In some embodiments, a second slot patterning to the first middle layer 127 of the first tetra-layer photoresist 121 may be performed as a "cut last" patterning with a second slot patterning of the second photoresist layer 329 of the first tetra-layer photoresist 121. As such, second slot openings 331 formed in the first middle layer 127 of the first tetra-layer photoresist 121 may have a low degree of line/width/roughness (LWR) and may have little to no wiggling (e.g., MD trench wiggling) of slot profiles of the second slot openings 331, as illustrated in FIGS. 4A-4B. Since there is a low degree of LWR and little to no MD trench wiggling, there is a lower risk of an MD-to-MG bridge forming between contacts. Furthermore, the "cut last" and tetra-layer photo scheme may be used with other cut schemes (e.g., cut oxide definition (cut OD), cut polysilicon (cut POLY), and cut metal).

In an embodiment, a method includes depositing a first mask layer over a target layer; forming a tetra-layer photoresist over the first mask layer; transferring a slot pattern of a first photoresist layer of the tetra-layer photoresist into a first middle layer of the tetra-layer photoresist; forming and transferring a cut pattern of an etch mask photoresist layer disposed over the slot pattern of the first middle layer into a bottom layer of the tetra-layer photoresist; transferring the slot pattern and the cut pattern of the bottom layer into the first mask layer; and etching the target layer using the slot pattern and the cut pattern of the first mask layer to form contact openings in the target layer. In an embodiment, the method further includes depositing a second photoresist layer over the first middle layer, after transferring the slot pattern of the first photoresist layer into the first middle layer; and transferring a second slot pattern of the second photoresist layer into the first middle layer of the tetra-layer photoresist, the second slot pattern being an overlap shift of the first slot pattern. In an embodiment, the transferring the slot pattern of the first photoresist layer into the first middle layer of the tetra-layer photoresist further includes exposing first surfaces of a second middle layer of the tetra-layer photoresist. In an embodiment, the first middle layer of the tetra-layer photoresist includes a silicon oxynitride material. In an embodiment, the second middle layer of the tetra-layer photoresist includes a metal oxide material. In an embodiment, the first middle layer is etched using a process gas including: a fluorine-containing gas selected from the group consisting of $CF_4$, $NF_3$, and combinations thereof and a polymer-forming gas selected from the group consisting of $CHF_3$, $CH_2F_2$, $CH_3F$, $C_4F_6$, $C_4F_8$, and combinations thereof. In an embodiment, the target layer includes an inter-dielectric layer disposed on a semiconductor substrate, the semiconductor substrate including a plurality of semiconductor fins. In an embodiment, the method further includes filling the contact openings in the target layer with a conductive material.

In an embodiment, a method includes forming a series of slotted openings in a first middle layer of a compound photoresist layer disposed over a semiconductor substrate; forming a patterned etching mask including a plurality of photoresist cut islands in a second photoresist layer disposed over the series of slotted openings in the first middle layer of the compound photoresist layer, the plurality of photoresist cut islands spanning across and filling a portion of one or more of the series of slotted openings in the first middle layer; transferring the series of slotted opening and the patterned etching mask into a bottom layer of the compound photoresist layer to form a cut mask; and using the cut mask to form contact openings through an inter-layer dielectric layer disposed over the semiconductor substrate, the contact openings exposing portions of source and drain regions of devices disposed within the semiconductor substrate. In an embodiment, the forming the series of slotted openings in the first middle layer of the compound photoresist layer includes forming a first series of slotted openings in the first middle layer. In an embodiment, the forming the series of slotted openings in the first middle layer of the compound photoresist layer includes, after forming the first series of slotted openings, forming a second series of slotted openings in the first middle layer, the second series of slotted openings being shifted from the series of the first slotted openings. In an embodiment, the forming the patterned etching mask in the bottom layer of the compound photoresist layer includes using a hard mask layer disposed between the bottom layer of the compound photoresist layer and the inter-layer dielectric layer as an etch stop layer for the bottom layer of the compound photoresist layer. In an embodiment, a material of the hard mask layer is a material selected from the group consisting of tungsten carbide and titanium nitride. In an embodiment, a first surface of the hard mask layer is in contact with the bottom layer of the compound photoresist layer and a second surface of the hard mask layer is in contact with the ILD layer, the second surface of the hard mask layer being opposite the first surface of the hard mask layer. In an embodiment, the forming the patterned etching mask includes wherein forming the series of slotted openings in the first middle layer of the compound photoresist layer includes using a second middle layer of the compound photoresist layer as a stop layer over the bottom layer of the compound photoresist layer.

In an embodiment, a method of forming contact plugs for FinFET devices includes depositing a hard mask layer over a semiconductor substrate; forming a tetra-layer photoresist layer over the hard mask layer; etching a series of slotted openings in a first middle layer of the tetra-layer photoresist layer; forming a patterned photoresist mask on remaining portions of the first middle layer; transferring the patterned photoresist mask and the series of slotted openings into a bottom layer of the tetra-layer photoresist layer; forming a cut mask in the hard mask layer using the patterned photoresist mask and the series of slotted openings in the bottom layer; etching contact openings through an inter-layer dielectric layer and to surfaces of source regions and drain regions of FinFET devices disposed within the semiconductor substrate; and depositing a conductive material in the contact openings to form contact plugs for the FinFET devices. In an embodiment, the depositing the hard mask layer over the semiconductor substrate includes depositing the hard mask layer in contact with the ILD layer. In an embodiment, the forming the tetra-layer photoresist layer over the hard mask layer comprises depositing a bottom layer of the tetra-layer photoresist layer over and in contact with a second surface of the hard mask layer. In an embodiment, the forming the patterned photoresist mask comprises forming a plurality of photoresist cut islands over and in contact with two or more of the remaining portions of the first middle layer, the photoresist cut islands extending over one or more of the series of slotted openings disposed between the remaining portions of the first middle layer. In an embodiment, the method further includes, before the transferring the patterned photoresist mask and the series of slotted openings into the bottom layer, using a second middle layer of the tetra-layer photoresist layer as an etch stop layer for the etching of the series of slotted openings in the first middle layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first mask layer over a target layer;
forming a tetra-layer photoresist over the first mask layer;
transferring a slot pattern of a first photoresist layer of the tetra-layer photoresist into a first middle layer of the tetra-layer photoresist;
forming a cut pattern of an etch mask photoresist layer over the slot pattern of the first middle layer;
transferring the cut pattern into a bottom layer of the tetra-layer photoresist;

transferring the slot pattern and the cut pattern of the bottom layer into the first mask layer; and etching the target layer using the slot pattern and the cut pattern of the first mask layer to form contact openings in the target layer.

2. The method according to claim 1, further comprising:

depositing a second photoresist layer over the first middle layer, after transferring the slot pattern of the first photoresist layer into the first middle layer; and transferring a second slot pattern of the second photoresist layer into the first middle layer of the tetra-layer photoresist, the second slot pattern being an overlap shift of the slot pattern of the first photoresist layer.

3. The method according to claim 2, wherein the transferring the slot pattern of the first photoresist layer into the first middle layer of the tetra-layer photoresist further comprises exposing first surfaces of a second middle layer of the tetra-layer photoresist.

4. The method according to claim 3, wherein the first middle layer of the tetra-layer photoresist comprises a silicon oxynitride material.

5. The method according to claim 4, wherein the second middle layer of the tetra-layer photoresist comprises a metal oxide material.

6. The method according to claim 4, wherein the first middle layer is etched using a process gas comprising:

a fluorine-containing gas selected from the group consisting of $CF_4$, $NF_3$, and combinations thereof; and a polymer-forming gas selected from the group consisting of $CHF_3$, $CH_2F_2$, $CH_3F$, $C_4F_6$, $C_4F_8$, and combinations thereof.

7. The method according to claim 1, wherein the target layer includes an inter-dielectric layer disposed on a semiconductor structure, the semiconductor structure including a plurality of semiconductor fins.

8. The method according to claim 1, further comprising filling the contact openings in the target layer with a conductive material.

9. A method comprising:

forming a series of slotted openings in a first middle layer of a compound photoresist layer disposed over a semiconductor structure;

forming a patterned etching mask including a plurality of photoresist cut islands in a second photoresist layer disposed over the series of slotted openings in the first middle layer of the compound photoresist layer, the plurality of photoresist cut islands spanning across and filling a portion of one or more of the series of slotted openings in the first middle layer;

transferring the series of slotted openings and the patterned etching mask into a bottom layer of the compound photoresist layer to form a cut mask; and using the cut mask to form contact openings through an inter-layer dielectric (ILD) layer disposed over the semiconductor structure, the contact openings exposing portions of source and drain regions of devices disposed within the semiconductor structure.

10. The method of claim 9, wherein the forming the series of slotted openings in the first middle layer of the compound photoresist layer comprises forming a first series of slotted openings in the first middle layer.

11. The method of claim 10, wherein the forming the series of slotted openings in the first middle layer of the compound photoresist layer comprises, after the forming the first series of slotted openings, forming a second series of slotted openings in the first middle layer, the second series of slotted openings being shifted from the first series of slotted openings.

12. The method of claim 9, wherein the forming the patterned etching mask in the bottom layer of the compound photoresist layer comprises using a hard mask layer disposed between the bottom layer of the compound photoresist layer and the inter-layer dielectric layer as an etch stop layer for the bottom layer of the compound photoresist layer.

13. The method of claim 12, wherein a material of the hard mask layer is a material selected from the group consisting of tungsten carbide and titanium nitride.

14. The method of claim 12, wherein a first surface of the hard mask layer is in contact with the bottom layer of the compound photoresist layer and a second surface of the hard mask layer is in contact with the ILD layer, the second surface of the hard mask layer being opposite the first surface of the hard mask layer.

15. The method of claim 12, wherein forming the series of slotted openings in the first middle layer of the compound photoresist layer includes using a second middle layer of the compound photoresist layer as a stop layer over the bottom layer of the compound photoresist layer.

16. A method of forming contact plugs for FinFET devices, comprising:

depositing a hard mask layer over a semiconductor structure;

forming a tetra-layer photoresist layer over the hard mask layer;

etching a series of slotted openings in a first middle layer of the tetra-layer photoresist layer;

forming a patterned photoresist mask on remaining portions of the first middle layer, the patterned photoresist mask spanning across and filling a portion of one or more of the series of slotted openings in the first middle layer;

transferring the patterned photoresist mask and the series of slotted openings into a bottom layer of the tetra-layer photoresist layer;

forming a cut mask in the hard mask layer using the patterned photoresist mask and the series of slotted openings in the bottom layer;

etching contact openings through an inter-layer dielectric (ILD) layer and to surfaces of source regions and drain regions of the FinFET devices disposed within the semiconductor structure; and depositing a conductive material in the contact openings to form contact plugs for the FinFET devices.

17. The method of claim 16, wherein the depositing the hard mask layer over the semiconductor substrate comprises depositing the hard mask layer in contact with the ILD layer.

18. The method of claim 17, wherein the forming the tetra-layer photoresist layer over the hard mask layer comprises depositing a bottom layer of the tetra-layer photoresist layer over and in contact with a second surface of the hard mask layer.

19. The method of claim 16, wherein the forming the patterned photoresist mask comprises forming a plurality of photoresist cut islands over and in contact with two or more of the remaining portions of the first middle layer, the photoresist cut islands extending over one or more of the series of slotted openings disposed between the remaining portions of the first middle layer.

20. The method of claim 16, further comprising: before the transferring the patterned photoresist mask and the series of slotted openings into the bottom layer, using a second middle layer of the tetra-layer photoresist layer as an etch stop layer for the etching of the series of slotted openings in the first middle layer.

\* \* \* \* \*